United States Patent
Kouznetsov

(10) Patent No.: US 8,685,213 B2
(45) Date of Patent: Apr. 1, 2014

(54) METHOD AND APPARATUS FOR PLASMA GENERATION

(75) Inventor: Vladimir Kouznetsov, Nynashamn (SE)

(73) Assignee: CemeCon AG, Würslen (DE)

( * ) Notice: Subject to any disclaimer, the term of this patent is extended or adjusted under 35 U.S.C. 154(b) by 1211 days.

(21) Appl. No.: 10/480,826

(22) PCT Filed: Jun. 14, 2002

(86) PCT No.: PCT/SE02/01160
§ 371 (c)(1),
(2), (4) Date: Jan. 4, 2005

(87) PCT Pub. No.: WO02/103078
PCT Pub. Date: Dec. 27, 2002

(65) Prior Publication Data
US 2005/0092596 A1    May 5, 2005

(30) Foreign Application Priority Data
Jun. 14, 2001    (SE) ...................... 0102134

(51) Int. Cl.
*C23C 14/00*    (2006.01)
*C23C 14/32*    (2006.01)
*C25B 9/00*    (2006.01)
*C25B 11/00*    (2006.01)
*C25B 13/00*    (2006.01)

(52) U.S. Cl.
USPC ............ 204/192.12; 204/192.13; 204/192.15; 204/298.02; 204/298.03; 204/298.08

(58) Field of Classification Search
USPC ............ 204/192.12, 192.13, 192.15, 298.02, 204/298.03, 298.08; 219/121.59; 315/111.41; 427/529, 571; 438/712
See application file for complete search history.

(56) References Cited

U.S. PATENT DOCUMENTS 4,277,304 A  *  7/1981  Horiike et al. ................ 438/712
4,495,399 A  *  1/1985  Cann ........................ 219/121.59

(Continued)

FOREIGN PATENT DOCUMENTS

| | | |
|---|---|---|
| EP | 0666335 A1 | 8/1995 |
| WO | 98/40532 A1 | 9/1998 |
| WO | WO99/47727 | 9/1999 |

OTHER PUBLICATIONS

Japanese Office Action issued in Application No. 2003-505388, mailed Aug. 5, 2008 (Japanese original and English translation).

(Continued)

*Primary Examiner* — Michael Band
(74) *Attorney, Agent, or Firm* — Christensen O'Connor Johnson Kindness PLLC

(57) ABSTRACT

In a simple method and device for producing plasma flows of a metal and/or a gas electric discharges are periodically produced between the anode and a metal magnetron sputtering cathode in crossed electric and magnetic fields in a chamber having a low pressure of a gas. The discharges are produced so that each discharge comprises a first period with a low electrical current passing between the anode and cathode for producing a metal vapor by magnetron sputtering, and a second period with a high electrical current passing between the anode and cathode for producing an ionization of gas and the produced metal vapor. Instead of the first period a constant current discharge can be used. Intensive gas or metal plasma flows can be produced without forming contracted arc discharges. The selfsputtering phenomenon can be used.

12 Claims, 13 Drawing Sheets

(56) References Cited

U.S. PATENT DOCUMENTS

| | | | | |
|---|---|---|---|---|
| 4,931,169 | A * | 6/1990 | Scherer et al. | 204/298.11 |
| 4,963,239 | A * | 10/1990 | Shimamura et al. | 204/192.12 |
| 5,015,493 | A * | 5/1991 | Gruen | 427/571 |
| 5,300,205 | A * | 4/1994 | Fritsche | 204/192.12 |
| 5,415,757 | A * | 5/1995 | Szcyrbowski et al. | 204/298.08 |
| 5,507,930 | A * | 4/1996 | Yamashita et al. | 204/192.15 |
| 5,846,608 | A * | 12/1998 | Neumann et al. | 427/529 |
| 5,990,668 | A * | 11/1999 | Coleman | 323/271 |
| 6,224,725 | B1 * | 5/2001 | Glocker | 204/298.19 |
| 6,306,265 | B1 * | 10/2001 | Fu et al. | 204/192.12 |
| 6,351,075 | B1 * | 2/2002 | Barankova et al. | 315/111.71 |
| 6,365,009 | B1 * | 4/2002 | Ishibashi | 204/192.12 |
| 6,413,382 | B1 * | 7/2002 | Wang et al. | 204/192.12 |
| 6,440,281 | B1 * | 8/2002 | Sturmer et al. | 204/298.08 |
| 6,511,584 | B1 * | 1/2003 | Szczyrbowski et al. | 204/192.22 |
| 6,853,142 | B2 * | 2/2005 | Chistyakov | 315/111.41 |

OTHER PUBLICATIONS

Japanese Patent Application Unexamined Publication No. 2000-273628, dated Oct. 3, 2000 (English Abstract).

Japanese Patent Application Unexamined Publication No. H5-156436, dated Jun. 22, 2993 (English Abstract).

Japanese Patent Application Unexamined Publication No. 2001-11621, dated Jan. 16, 2001 (English Abstract).

Japanese Patent Application Unexamined publication No. 2000-256845 (English Abstract).

Japanese Patent Application Unexamined Publication No. H11-293469, dated Oct. 26, 1999 (English Abstract).

Japanese Patent Application Unexamined Publication No. H7-258849, dated Oct. 9, 1995 (English Abstract).

Japanese Patent Application Unexamined Publication No. 2001-158961A, dated Jun. 12, 2001 (English Abstract).

J. Vac. Sci. Technol. A, vol. 18, No. 4, 2000, K. Macak et al; "Ionized Sputter Deposition Using an Extremely High Plasma Density Pulsed Magnetron Discharge"; pp. 1533-1537.

J. Vac. Sci. Technol. A, vol. 19, No. 2, 2001, J. Musil et al; "Pulsed DC Magnetron Discharge for High-Rate Sputtering on Thin Films"; pp. 420-424.

Surface and Coatings Technology, vol. 122, 1999, V. Kouznetsov et al; "A Novel Pulsed Magnetron Sputter Technique Utilizing Very High Target Power Densities"; pp. 290-293.

International Search Report for International Application No. PCT/SE 02/01160, published Dec. 14, 2003.

\* cited by examiner

Fig. 1a Fig. 1b Fig. 1c
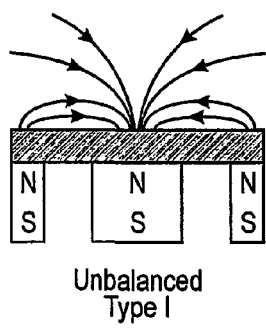
Unbalanced
Type I
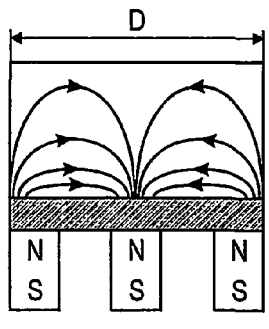
Balanced
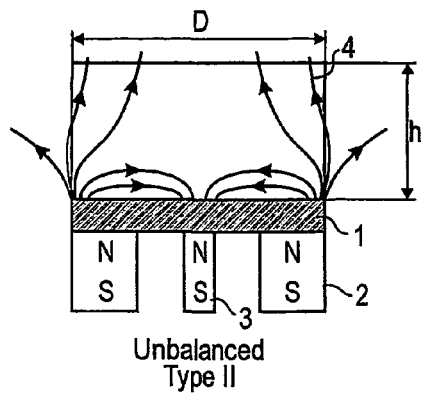
Unbalanced
Type II
Fig. 1d Fig. 1e
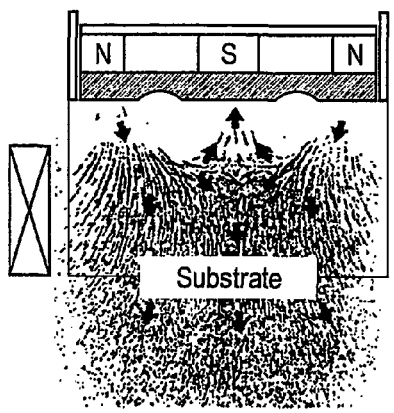
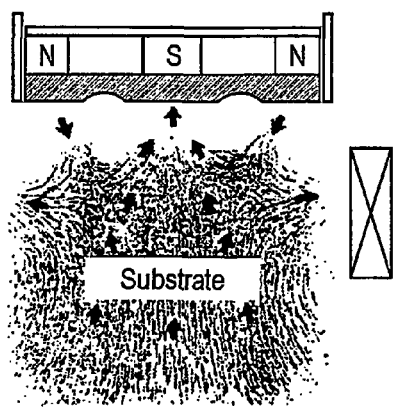
Fig. 1f
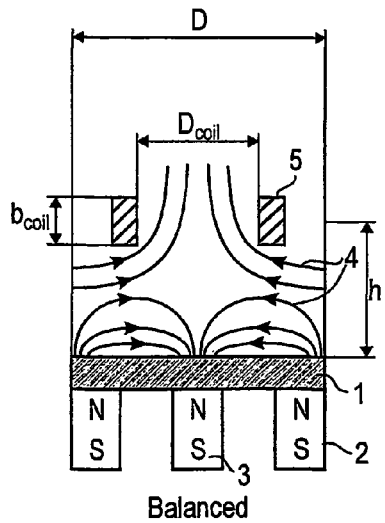
Balanced

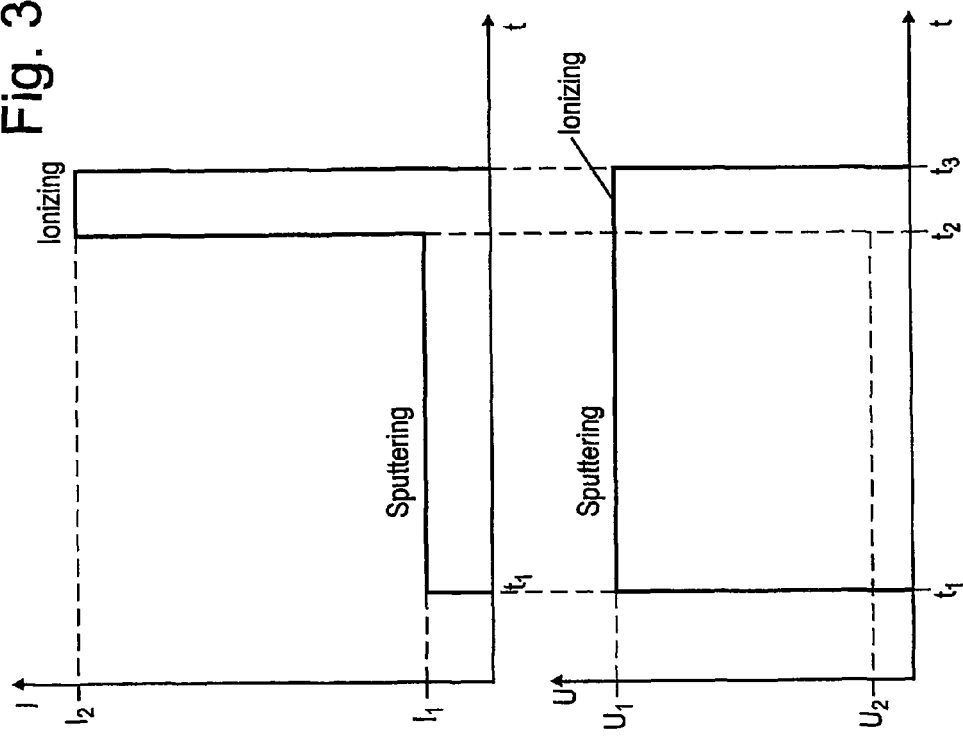
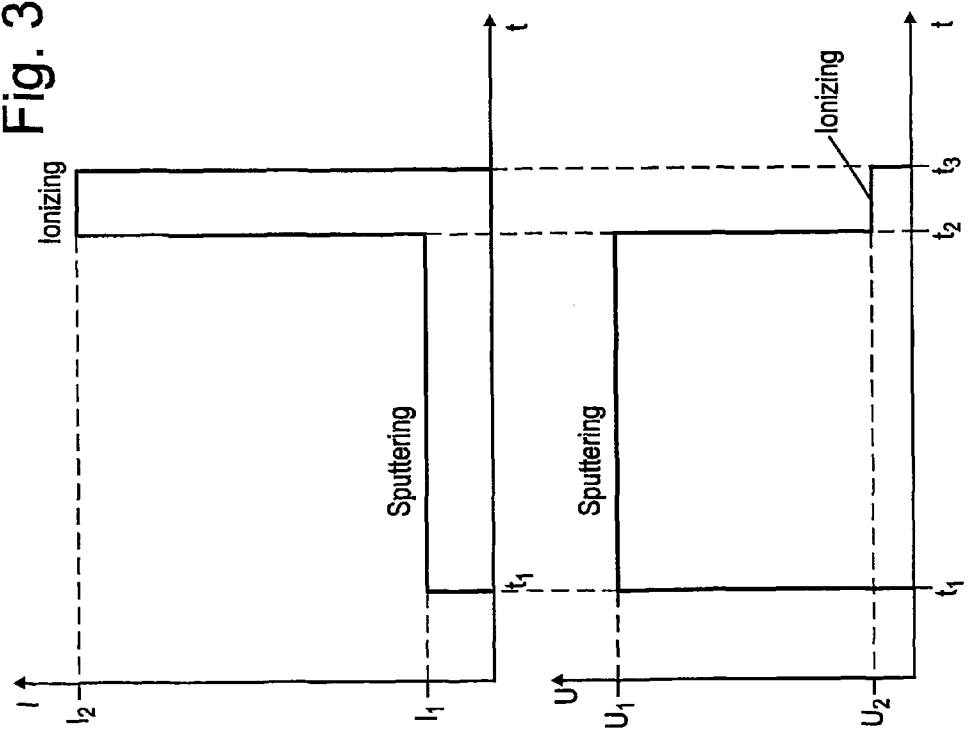

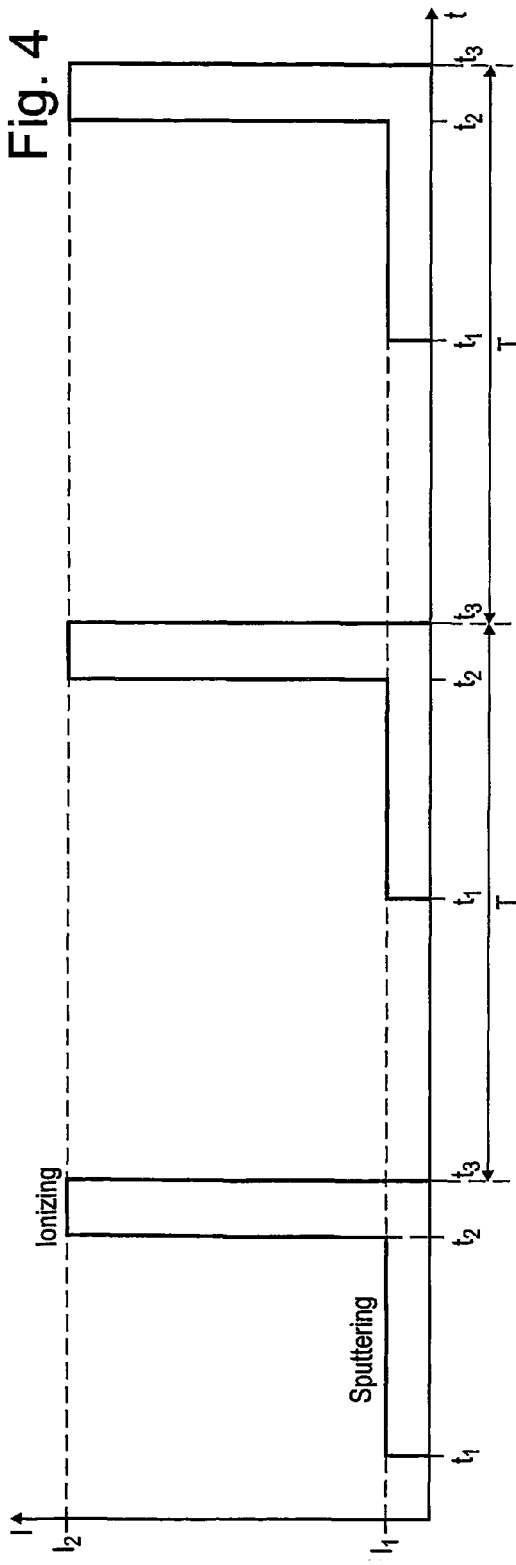
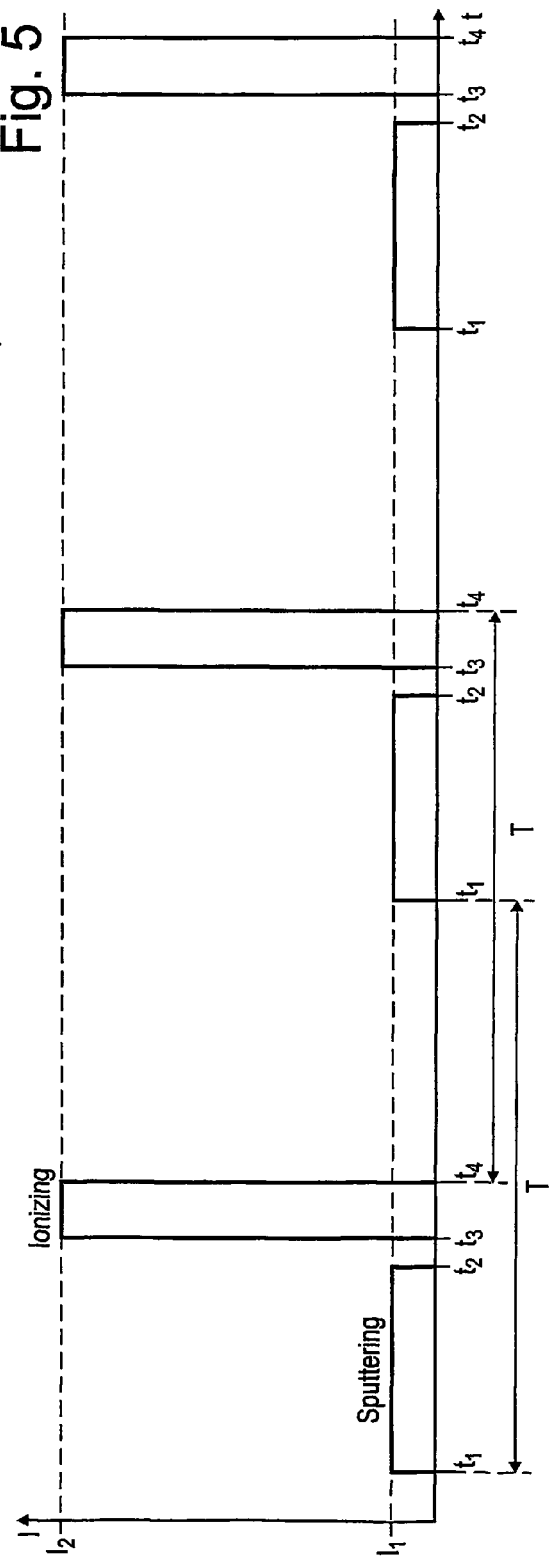

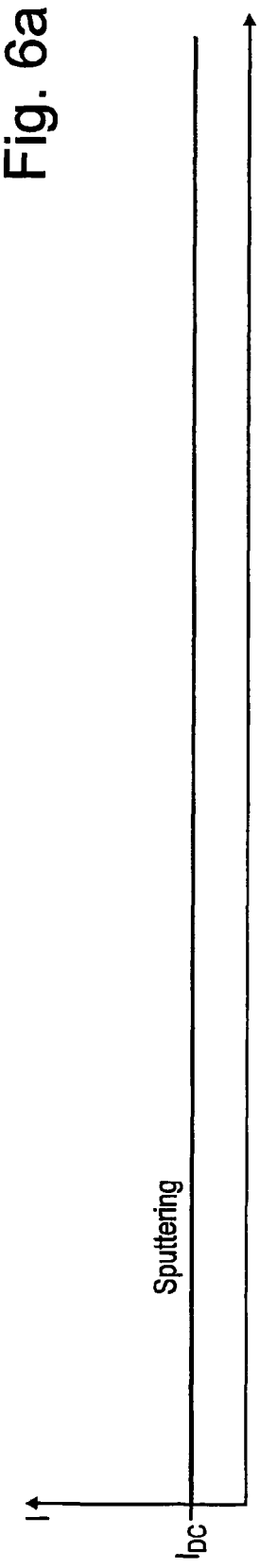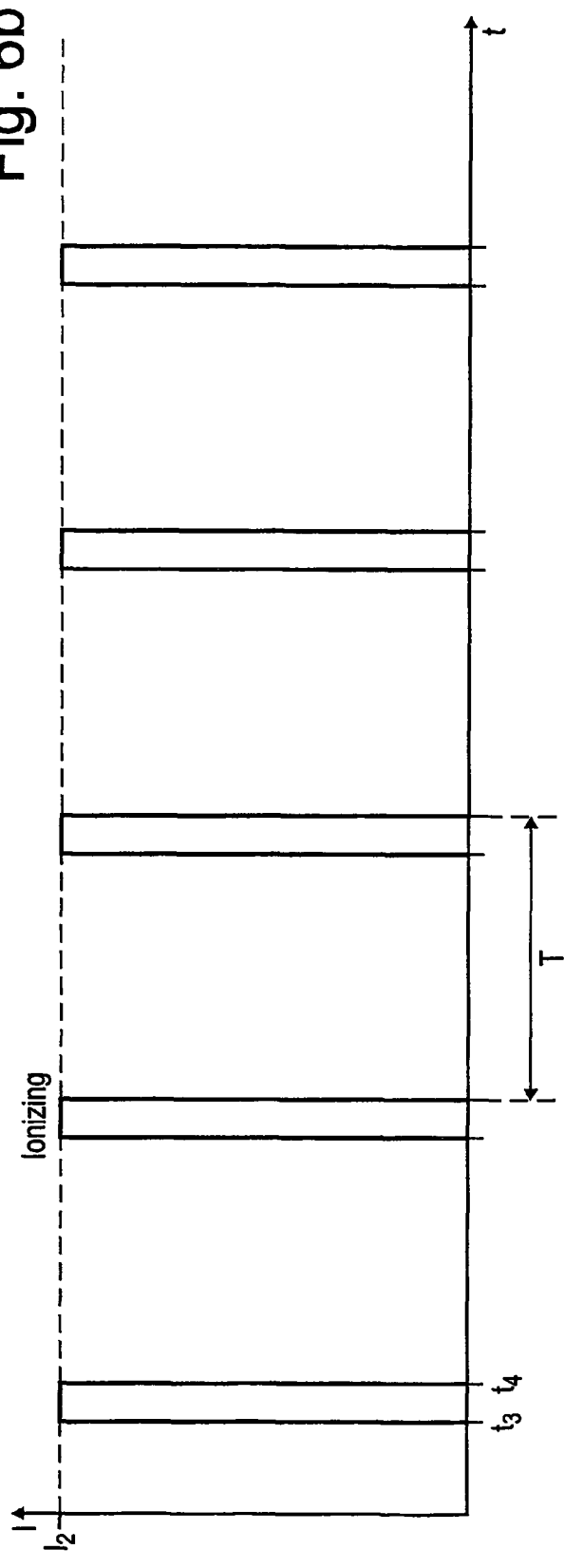

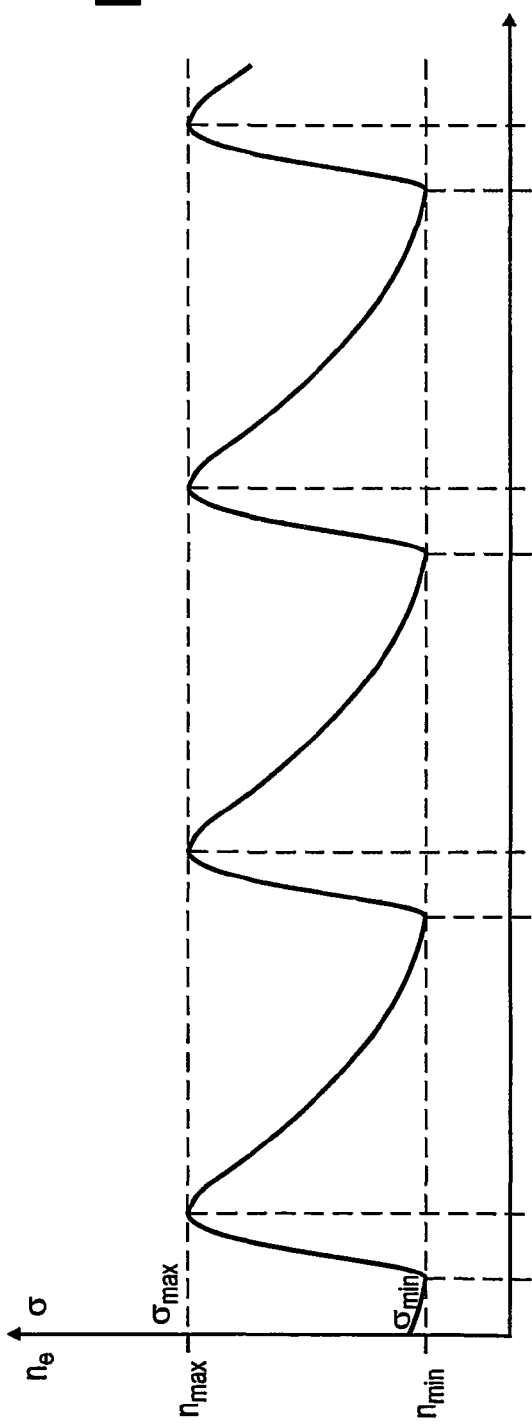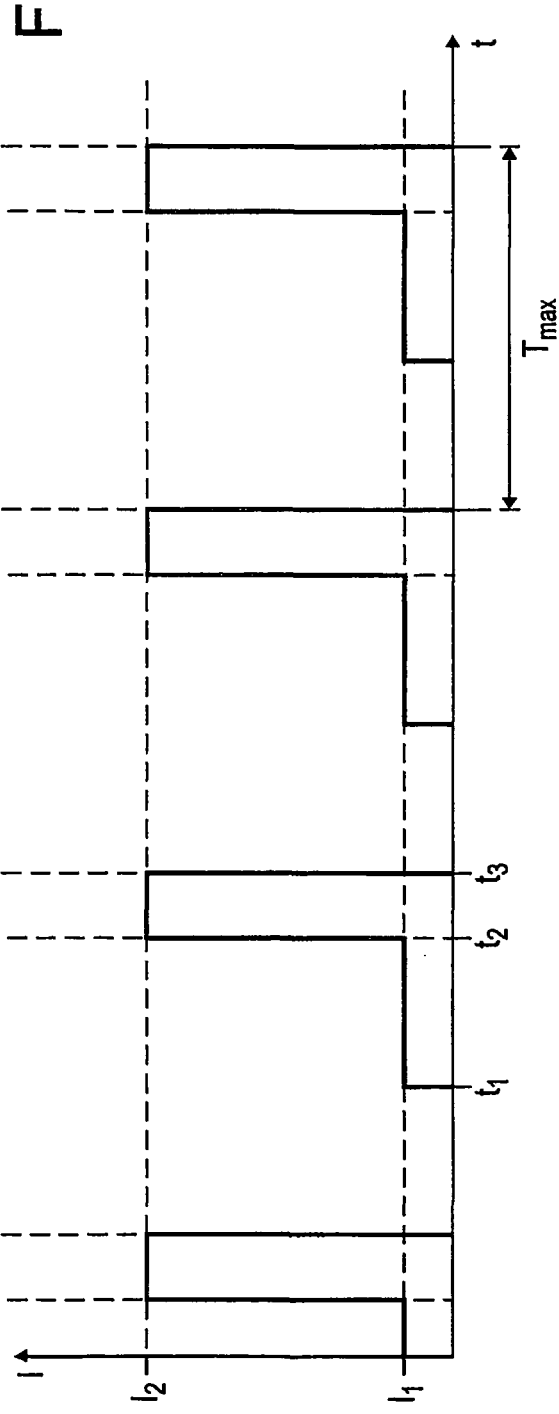

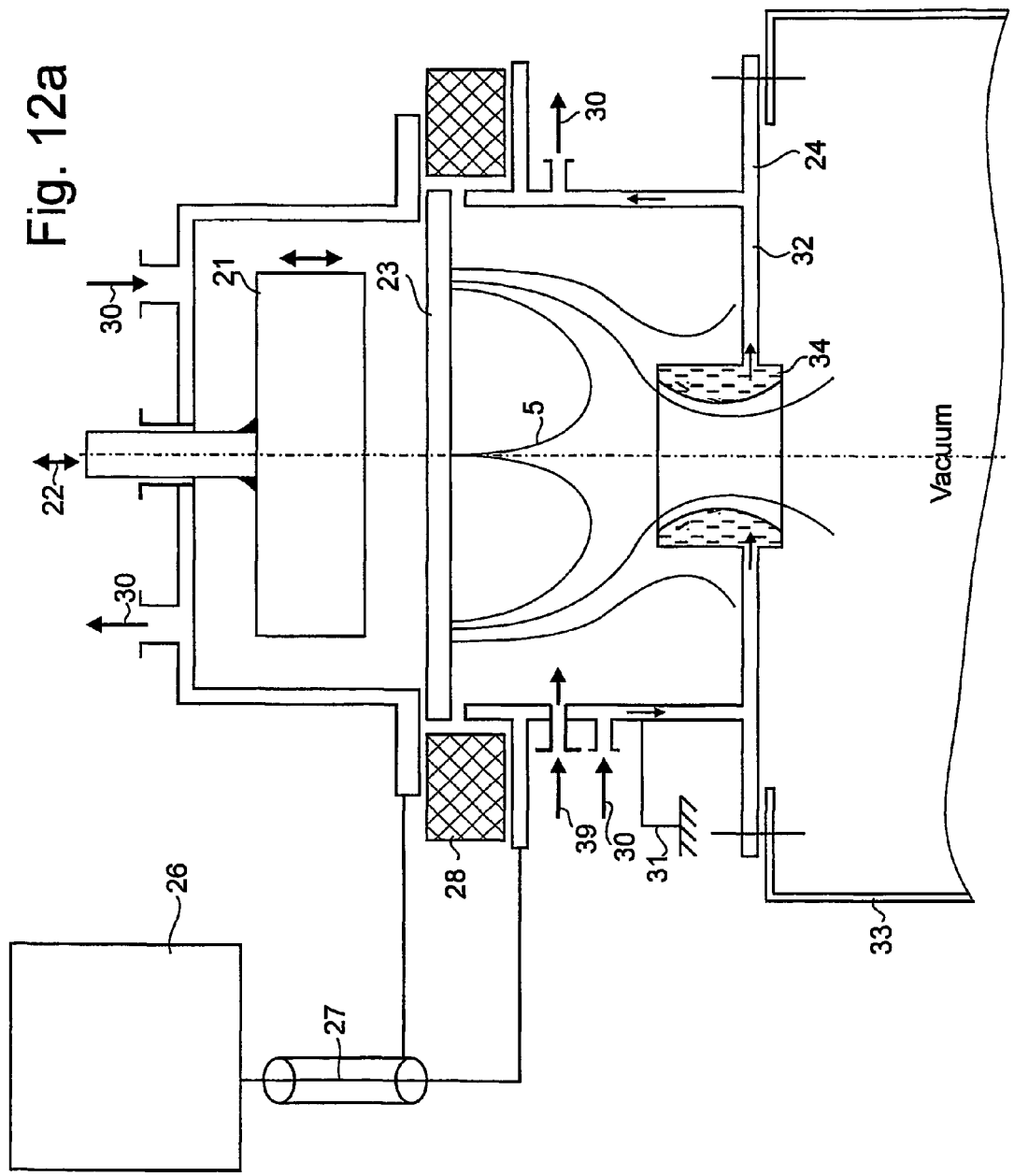

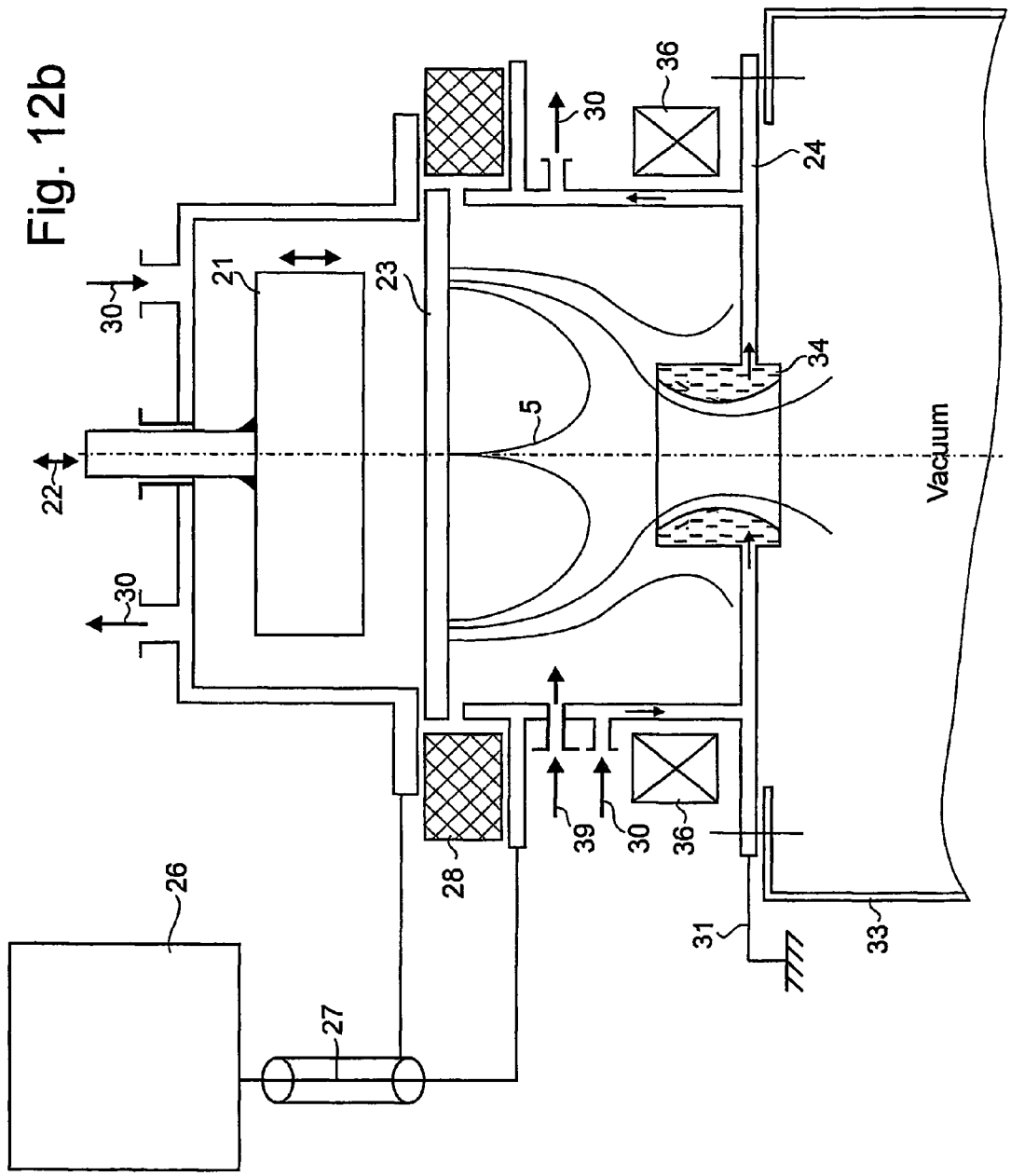

METHOD AND APPARATUS FOR PLASMA GENERATION

This application is the U.S. national phase of international application PCT/SE02/01160, filed in English on 14 Jun. 2002, which designated the U.S. PCT/SE02/01160 claims priority to SE Application No. 010213-4 filed 14 Jun. 2001. The entire contents of these applications are incorporated herein by reference.

TECHNICAL FIELD

The present invention relates to methods and apparatus for generating plasma flows and in particular metals plasma flows obtained by discharges in crossed electric and magnetic fields.

BACKGROUND OF THE INVENTION

Electrical discharges in crossed fields (EXB discharges) attract much attention due to their importance for science and technology. In science EXB discharges are important in the field of plasma physics and cosmic physics. In technology EXB discharges are used in devices for thermonuclear fusion, in vacuum technology such as in vacuum pumps, vacuum measurements, for coating work pieces using e.g. magnetron sputtering, in plasma accelerators, and as plasma emitters in ion sources.

The motion of charged particles in stationary crossed fields and quasi-stationary EXB discharges have been studied since 1921, see the article by A. W. Hull, "The effect of a uniform magnetic field on the motion of electrons between coaxial cylinders", Phys. Rev. 18, 1921, pp. 31-57, and by H. C. Early, W. G. Dow, "Supersonic Wind at Low Pressures Produced by Arc in Magnetic Field", Phys. Rev. 79, 1950, p. 186. Such discharges could be classified according to different parameters such as gas pressure, strength and configuration of the magnetic field used, electrode configuration etc. For the purposes herein these discharges are best classified according to the intensity or generally the behaviour of the discharge or driving current.

According to this classification using the driving current, quasi-stationary discharges in crossed fields could be divided in two classes: low intensity and high intensity current discharges. It is necessary to note that the transition current depends on many parameters, in particular on the dimensions of the apparatus used, and can vary for hundreds of amperes. Low intensity current discharges in crossed fields could be called such discharges which produce a plasma inside a magnetic configuration with a density less than $10^{18}$ m$^{-3}$ and high intensity current discharges could be called such discharges which produce a plasma having a density of more than $10^{18}$ m$^{-3}$, the plasma density defined as the number of particles per unit volume.

Low intensity current discharges in crossed fields are widely used in vacuum technology such as in vacuum pumps, for coating work pieces, e.g. in magnetron sputter deposition. Typical discharge devices are Penning cells and cylindrical and planar DC-magnetrons. The low driving current results in a low-density plasma, less than $10^{18}$ m$^{-3}$ as indicated above.

High intensity current discharges have been mostly used for generating dense plasma for the goals of thermonuclear fusion. Typical discharge devices include Homopolar I, Ixion and F I devices. The typical plasma density is about $10^{18}$-$10^{23}$ m$^{-3}$.

The second important characteristic of discharges in crossed fields is the voltage drop between the electrodes.

For a low intensity driving current the rate of neutral gas ionization is low and balances the plasma losses to form an equilibrium plasma density at a low level. The electrical resistance of the anode-cathode gap is high resulting in a high anode-cathode potential drop. As soon as an opposite process becomes energetically possible a strongly enhanced ionization process should arise.

Two methods have been described for plasma ionization in systems using with discharges in crossed electric and magnetic fields. Their practical applicability depends on system dimensions and the strength of the magnetic field. The method generally accepted in systems of sufficiently large dimensions using a strong magnetic field is the so called "Rotating Plasma Approach". This approach is based on the fact that the electric field penetrates into the plasma and that the plasma is magnetized, see B. Lehnert, "Rotating Plasmas", Nuclear Fusion 11, 1971, pp. 485-533. Another approach is based on fact that the electric field is concentrated preferably near the cathode of the discharge. This approach is used for processes in systems using a low magnetic field and non-magnetized ions. This approach could be called e.g. "Secondary Electron Approach", see B. S. Danilin and B. K. Sirchin, Magnetron Sputtering Systems, Moskva, Radio i Sviaz, 1982. As will be obvious from the following this invention deals with both kinds of systems and therefore both plasma approaches will be used.

Alfvén has postulated, see H. Alfvén, "On the Origin of the Solar System", Clarendon Press, Oxford, 1954, that a strongly enhanced ionization process should arise when the mutual plasma-neutral gas velocity reaches the critical value $v_c$, the Alfvén limit, given by $$v_c = (2e\phi_i/m_i)^{1/2}$$

where $\phi_i$ is the ionization potential, e is the charge of the electron and $m_i$ is the ion mass.

For devices having a low sputtering rate and low plasma losses it results in an anode-cathode voltage drop limitation during the starting period of the discharge. For devices having a high sputtering rate it results in an anode-cathode voltage drop limitation during all of the discharge time. The voltage drop or critical voltage $V_c$ is given by $$V_c = Cv_cB$$

where C is a constant and B is the strength of magnetic field in the discharge device. In the case of a high sputtering rate, the ionization potential $\phi_i$ of the sputtered atoms creates the metal vapor. It means that the discharge voltage has to depend on the sputtering cathode material.

This phenomenon was demonstrated both by investigation of plasma motion through a neutral gas and by experiments with planar magnetron sputtering devices, see U. V. Fahleson, "Experiments with Plasma Moving through Neutral Gas", Physics Fluids, Vol. 4, 1961, pp. 123-127, and D. V. Mozgrin, I. K. Fetisov, and G. V. Khodachenko, "High-Current Low-Pressure Quasi-Stationary Discharge in a Magnetic Field: Experimental Research", Plasma Physics Reports, Vol. 21, No. 5, 1995, pp. 400-409. In the latter publication the high current, low voltage discharge in a magnetron magnetic configuration is called as a "high-current diffuse regime".

It means that the transition from a low intensity current EXB discharge to a high intensity current discharge has to be followed by a decrease of the discharge voltage. Typical anode-cathode potential drops for low intensity current, quasi-stationary discharges are in the range of about 10-0.3 kV and for high intensity current discharges in the range of about 300-10 V.

If quasi-stationary discharges are implemented in magnetron sputtering devices, in a first regime effective cathode sputtering is obtained but a low ionization rate of the sputtering gas and metal vapor. In a second regime an opposite state occurs having a low sputtering rate but a high ionization rate of the sputtering gas. Thus, it can be said that it is impossible to generate, by a separate low intensity current quasi-stationary discharge, or by a separate high intensity current discharge in crossed fields, highly ionized metal plasma fluxes.

The devices using EXB discharges can operate for a short time in the transient, i.e. the non-quasi-stationary, regime. In this regime it is possible to overcome the Alfvén limit of discharge voltage as well for high current discharges, see the article by B. Lehnert cited above. High current, high voltage non-quasi-stationary discharges occur in magnetron sputtering devices and are very important for magnetron sputtering applications because those discharges allow obtaining a fully ionized impermeable plasma in the magnetron magnetic configuration. But, as will be shown hereinafter, if transient discharges are implemented in magnetron sputtering devices by either high intensity current discharges or by low intensity current discharges it is impossible to generate highly ionized intensive metal plasma fluxes.

Metal plasma fluxes can be produced by low current quasi-stationary EXB discharges in a magnetron configuration for sputtering atoms in a moderate pressure, of e.g. 1-100 mTorr, and with a low-density plasma In this case the plasma is produced by an RF-induction coil mounted in the deposition chamber. The electron density produced in induction plasmas is about $10^{17}$-$10^{18}$ m$^{-3}$.

This method of coating work pieces has important implications for the filling of high-aspect-ratio trenches and vias encountered in microelectronic fabrication processes as well as in sputtering magnetic materials and modifying the properties of thin films by energetic ion deposition, see J. Hopwood and F. Qian, "Mechanisms for highly ionized magnetron sputtering", J. Appl. Phys. 78 (12), 15 Jul. 1995, pp. 758-765.

The drawbacks of this method of metal plasma production include the complexity of the RF-ionization technique and the high pressure of the sputtering gas required for producing the low-density plasma. The high pressure of the sputtering gas is required because of the high energy consumption necessary for producing a low-density plasma.

The discharges in crossed fields could be implemented by simple techniques and within an extremely wide range of operating pressures: from $10^{-11}$ up to $10^2$ Torr. Low-pressure magnetron discharges, up to $10^{-5}$ Torr, can be achieved because of the selfsputtering phenomenon, see for example S. Kadlec and J. Musil, "Low pressure magnetron sputtering and selfsputtering discharges", Vacuum, Vol. 47, pp. 307-311, 1996. This method of coating work pieces has important implications for the etching of surfaces by metal ions for increasing the adhesion of deposited layers and for the filling of high-aspect-ratio trenches and vias encountered in microelectronic fabrication.

The currents necessary for generating a dense plasma and sustaining it by high intensity current EXB discharges are large enough for cathode spots, and possibly also for anode spots, to be formed at the cold electrode surfaces. Devices having such electrodes should therefore have a natural tendency of forming spoke-shaped azimuthal plasma inhomogeneities, arc discharges, see B. A. Tozer, "Rotating Plasma", Proc. IEEE, Vol. 112, 1965, pp. 218-228. Such conditions are strongly pronounced in all types of devices during the starting period of the discharges where a large driving current is needed for neutral gas burn-out.

Having cold electrodes and neutral-plasma phenomena in mind, the experiments on plasma spoke formation can be summarized as follows:

a. In the Homopolar III experiments it was found that during the starting period the discharge current was confined to a set of about 10 to 12 narrow radial spokes, arcs, rotating with the plasma. See W. R. Baker, A. Bratenal, A. W. De Sliva, W. B. Kunkel, Proc. 4$^{th}$ Int. Conf. Ionization Phenomena in Gases 2, Uppsala 1959, North-Holland Publishing Comp., Amsterdam, p. 1171, and W. B. Kunkel, W. R. Baker, A. Bratenahl, K. Halbach, "Boundary Effects in Viscous Rotating Plasmas", Physics Fluids, Vol. 6, 1963, pp. 699-708.

b. In the Leatherhead Homopolar device having a negative polarity one or two spokes were observed to arise during the initial breakdown of the discharge. They were soon smeared out to form spirals with an increasing velocity in the outward radial direction, see P. B. Barber, M. L. Pilcher, D. A. Swift, B. A. Tozer, C. r. de la VI$^e$ conference internationale sur les phenomenes d'ionization dans le gas 2, Paris, 1963, p. 395.

c. In the Kruisvuur I device a single eccentric structure rotating around the axis with a velocity close to E/B was observed, see C. E. Rasmussen, E. P. Barbian, J. Kistemaker, "Ionization and current growth in an ExB discharge", Plasma Physics, Vol. 11, 1969, pp. 183-195.

From the experiments mentioned above and others, arc formation is clearly seen to be connected with the starting period of the high intensity current EXB discharges in most devices.

SUMMARY OF THE INVENTION

It is an object of the present invention to provide methods and apparatus allowing production of intensive, preferably gas or gas-metal or most preferably metal plasma flows.

The problems, which the invention thus intends to solve, comprise:

1. How to produce intensive, preferably gas or gas-metal or preferably metal plasma flows by ionization of gas and metal vapor produced using planar magnetron sputtering cathodes by a simple technique for producing discharges in crossed fields.
2. How to produce these plasma flows without forming contracted arc discharges.
3. How to provide pulsed discharges in crossed fields using the selfsputtering phenomenon.

Thus, generally in a method for producing a plasma flow successive low and high intensity current quasi-stationary and non quasi-stationary discharges in crossed electric and magnetic fields are used, the term "crossed fields" meaning "crossed electric and magnetic fields" herein. For producing the plasma a succession of discharges is thus used, i.e. pulsed discharges are used. The discharges that are well separated in time are defined to be quasi-stationary in the cases where at least the most important physical parameters, such as current and voltage, are substantially constant or slowly varying during most of the discharge time, and are, if this condition is not fulfilled, non-quasi stationary. The plasma flow producing procedure can include the following steps:

1. A low intensity current, high voltage discharge in a magnetron magnetic configuration is used for metal vapor production. The following ionization of vapor is obtained by a high intensity current, low or high voltage discharge in the same magnetic configuration. The second, ionizing discharge starts immediately after the first one or with some, relatively small time delay. The parameters of the pulses and time delay of the second pulse are defined by the requirements imposed by the high ionization of sputtered vapor blobs.

2. The metal vapor can be produced by a direct current discharge, i.e. not by pulsed discharges. In this case the metal vapor produces a continuous vapor flow out of the magnetic configuration where the discharge is made. If ionizing pulses follow having a sufficient frequency and driving current it is possible to produce a continuous metal plasma flow having a modulated intensity.

The following basic schemes can be used:
1. The plasma can be produced in a magnetron magnetic configuration in which combined or successive low and high intensity current non-quasi-stationary discharges in crossed fields are used.
2. The plasma can be produced in a magnetron magnetic configuration in which a low intensity current quasi-stationary discharge is combined with or followed by a high intensity current non-quasi-stationary discharge, the discharges made in crossed fields.
3. The plasma can be produced in a magnetron magnetic configuration in which combined direct current discharges and high current non-quasi-stationary discharges in crossed fields are used.
4. The plasma can be produced in a magnetron magnetic configuration in which combined low intensity current non-quasi-stationary discharges and high intensity current quasi-stationary discharges in crossed fields are used.
5. The plasma can be produced in a magnetron magnetic configuration in which combined successive low and high intensity current non-quasi-stationary discharges and high intensity current quasi-stationary discharges in crossed fields are used.
6. The plasma can be produced in a magnetron magnetic configuration in which combined high intensity current non-quasi-stationary discharges and high intensity current quasi-stationary discharges in crossed fields are used.

The combinations of discharges in crossed electric and magnetic fields mentioned above made in a magnetron magnetic configuration allow the production of plasma flows of preferably gas or gas and metal or most preferably of a metal plasma flow. For quasi-stationary discharges the choice of method can be based on the different efficiencies of the low and high current intensity discharges for sputtering and ionization in the different cases.

The discharges in crossed fields have, as has been mentioned above, a natural tendency of forming spoke-shaped azimuthal plasma inhomogeneities—arc discharges. The probability of the transition of an EXB discharge in magnetron type devices to a contracted arc discharge increases with an increasing driving current. In low current discharges arcing occurs very rarely and it is possible to prevent the transition to arc discharges by specially adapted arc suppression schemes in the discharge power supply. In high current discharges there is a very high probability of arc discharges being formed and solutions to the problem of suppressing arc formation using similar schemes are not efficient. As will be described herein, arc suppression can be achieved using a now discovered phenomenon of dependence of arc formation on the plasma confinement properties of the magnetron magnetic configuration and on the time between discharges. The balanced magnetron magnetic configuration has relatively low plasma confinement properties. Therefore, for achieving efficient arc suppression, it is necessary to use a magnetic field having a high strength. In this case the plasma losses caused by diffusion will decrease as $B^{-2}$ in the case of classic diffusion or as $B^{-1}$ in the case of Bohm diffusion, where B is the strength of the magnetic field. It was found that for a balanced magnetron magnetic configuration, in order to achieve efficient arc suppression, it is necessary to have a magnetic field strength of the radial B component of about 0.07-0.3 T, the radial direction here taken as directions parallel to the substantially flat surface of the cathode or target. Unbalanced and cusp-shaped magnetic configurations have improved plasma confinement properties; therefore, for effective arc suppression it is sufficient to have a magnetic field strength of about 0.04-0.3 T.

The plasma confinement properties of the magnetic configuration strongly affect the lower limit of the operating pressure used in the space at the cathode. It was found that for improving the plasma confinement properties the operating pressure of the EXB discharge should be decreased. For a certain operating frequency a gas atmosphere is required only for starting the discharge. After the starting period it is possible to initiate the discharge by the residual plasma density left from the previous pulse. In this case metal vapor is produced by using the selfsputtering phenomenon and the plasma in the magnetic trap contains primarily ions of the target metal. The plasma flow from the magnetic trap contains preferably ions of the target metal as well.

Generally, it can be said that the primary concept of the method described herein is to combine the magnetic configuration having improved plasma confinement properties with low and high intensity current quasi-stationary discharges and non-quasi-stationary discharges or DC and high intensity current discharges for generating stable and intensive plasma flows. Low and high intensity current quasi-stationary discharges and non-quasi-stationary discharges are produced one after another with a repeating frequency exceeding a minimal critical value depending on the plasma confinement properties of the magnetic trap. In the case of DC sputtering discharges, a high rate of ionization of gas and metal vapor is produced by a periodic repetition of the ionizing discharges.

The methods and devices described herein can be used both in the "Rotating Plasma Approach" and the "Secondary Electron Approach" mentioned above.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

FIGS. 1a-1f are schematic views of different magnetron magnetic configurations used in magnetron sputtering, in which —FIG. 1a is a view of a first type of an unbalanced magnetron magnetic configuration, FIG. 1b is a view of a balanced magnetron magnetic configuration, FIG. 1c is a view of a second type of an unbalanced magnetron magnetic configuration, FIGS. 1d and 1e are views illustrating the magnetic configuration created by permanent magnets placed behind the target and an electromagnetic coil placed in front of the target, FIG. 1f is a view of a cusp-shaped magnetic configuration, FIGS. 3a and 3b are schematic diagrams of current and voltage pulses respectively as functions of time for sputtering and ionizing discharges in crossed fields, FIG. 4 is a schematic diagram of periodic current pulses of the kind illustrated in FIG. 3a as a function of time, FIG. 5 is a schematic diagram similar to that of FIG. 4 showing an alternative shape of the current pulses, FIG. 6 is a schematic diagram similar to that of FIG. 4 showing current pulses superimposed on a constant current level, FIG. 7a is a schematic diagram of the conductivity and plasma density as a function of time in a plasma confinement region, FIG. 7b is a schematic diagram substantially identical to that of FIG. 4 showing the driving current pulses for producing the conductivity and plasma density of FIG. 7a, FIG. 8a is an electrical circuit diagram of a device for producing a metal vapor and the ionization thereof, the device having two pulsed power supplies connected in parallel, FIG. 12a is a schematic cross-sectional view of a plasma source utilizing discharges in crossed electric and magnetic fields for gas or gas and metal or metal plasma production, corresponding to the second type of unbalanced magnetron magnetic configuration shown in FIG. 1c, and FIG. 12b is a schematic view similar to that of FIG. 12a illustrating a plasma source utilizing discharges in crossed electric and magnetic fields for gas or gas and metal or metal plasma production, corresponding to the types of magnetron magnetic configurations shown in FIGS. 1d and 1f.

DETAILED DESCRIPTION

Figure 1G:
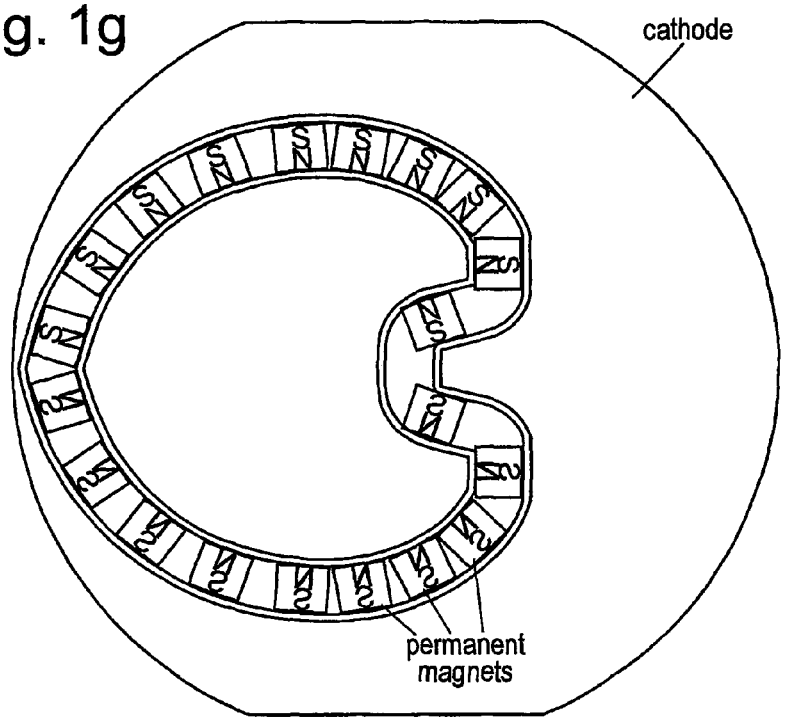
FIG. 1g is a view from above of a magnetic configuration typical of magnetrons having a rotating magnet.

The magnet configurations of magnetron sputtering cathodes preferably used in the conventional art for a magnetic field strength of up to 0.1 T are illustrated in FIGS. 1b-1f. Thus, in FIG. 1b a balanced magnetron magnetic configuration is shown whereas in FIGS. 1a and 1c unbalanced magnetron magnetic configurations are shown. The altering of the magnetic field configuration is here made by altering the configuration of the permanent magnets in the magnetron source.

Thus, in the schematic diagram of FIG. 1a a first type of an unbalanced magnetron magnetic configuration is illustrated. The magnetron sputtering cathode 1 is a substantially flat body of the material to be sputtered and can have the shape of circular disc or a rectangular plate. At the rear or bottom surface of the cathode a permanent magnet assembly is illustrated comprising an outer magnet 2 and a central magnet 3, the central magnet located at the center of the rear side of the cathode and the outer magnet located at the edge of the rear side of the cathode. The lines having arrows show the direction of magnetic force lines. The strength of the central permanent magnet 3 is selected to be larger than the strength of the outer magnet 2 so that among the magnetic field lines 4, generally going from the north poles to the south poles of the magnets, some field lines extend only between the poles of the central permanent magnet.

In the view of a balanced magnetron magnetic configuration in FIG. 1b it is seen to have substantially the same set-up as the magnetron configuration as in FIG. 1a However, the strength of the central magnet is selected to be equal to the strength of the outer magnet so that substantially all magnetic field lines extend between a pole of the central magnet 3 and a pole of the outer magnet 2. The shaded area in the figure is the area of plasma confinement and also the area in which the power dissipation of the discharge occurs.

In the schematic of FIG. 1c a view of a second type of an unbalanced magnetron magnetic configuration is illustrated, in which the strength of the permanent magnets is selected in still another way. Here, some field lines extend between the poles of the outer magnet, the field lines starting or ending at the central magnet all having their other ends at the outer magnet.

The unbalanced configurations as shown in FIGS. 1a and 1b are classified as Type I or Type II respectively, see B. Window and N. Savvides, "Charged particle fluxes from planar magnetron sputtering sources", J. Vac. Sci. Technol, A 4(2), 1986, pp. 196-202.

An alternative way to accomplish different magnetic configurations is to use an external, preferably toroidal, magnetic coil, see I. Ivanov, P. Kazansky, L. Hultman, I. Petrov, and J-E. Sundgren, "Influence of an external axial magnetic field on the plasma characteristics and deposition conditions during direct current planar magnetron sputtering", J. Vac. Sci. Technol., A 12(2), 1994, pp. 314-320. Thus, in the views of FIGS. 1d, 1e and 1f magnetic configurations created by permanent magnets 2, 3 placed behind the target 1 and an electromagnetic coil 5 placed in front of the target are shown. In FIGS. 1d and 1e the coil has a diameter larger than the diameter of the target. The arrows show the direction of the magnetic field. In FIG. 1f a cusp-shaped magnetic configuration is shown in which the coil 5 has a diameter smaller than the diameter of the target and of the outer magnet. The electromagnetic coil 5 has a height $b_{coil}$, i.e. the extension thereof in a direction perpendicular to the plane of the cathode 1, and an inner diameter $D_{coil}$. h and D are generally the height and diameter of the region of plasma confinement, the power dissipation of the discharge occurring in this region. The shape of the plasma confinement region can roughly be considered as a cylinder, having a diameter D and a height h, for a planar circular cathode 1 or as rectangular parallelepiped for a planar rectangular cathode. In the latter case D is the smallest dimension of cathode and the smallest dimension of the base surface of the parallelepiped and h is the height of the parallelepiped.

Depending on the direction of the electric current in the coil 5, its field can be used for assisting either the outer pole 2 or the center pole 3 of the permanent magnets as illustrated by FIGS. 1d and 1e. This technique provides a plasma density inside the plasma confinement region of about $10^{16}$ $m^{-3}$ and provides for means of varying the ion flux at the cathode or substrate by more than one order of magnitude. But still, the ionization rate is less than 10%. Therefore, the variation only of magnetic field strength and its geometry cannot give a sputtering magnetron cathode acting as a metal plasma source having a high equivalent current.

The cusp-shaped magnetic configuration of FIG. 1*f* has been used for production of a dense plasma by high current quasi-stationary discharges generated by periodic pulses having a low frequency, less than 10 Hz. Two axially symmetric electromagnetic coils having opposite current directions created the cusp shaped magnetic configuration, see the article by D. V. Mozgrin et al. cited above.

The configuration including a cusp-shaped magnetic field created by permanent magnets and an electromagnetic coil as illustrated by FIG. 1*f* will now be considered. There, the electromagnetic coil 5 is placed at a distance h=aD, h also being the height of the plasma confinement region, from the exposed, front surface of the sputtering magnetron cathode 1, where a is a coefficient having a value in the range of 0.1-1 and D as above is the diameter of the confinement region and thus the diameter of the cathode for a circular shape thereof or equal to the smallest dimension of the cathode for a rectangular planar shape thereof. The inner dimension of the electromagnetic coil 5, for a circular shape thereof, is $D_{coil}$=bD, where b is a coefficient having a value in the range of 0.4-1.4 and $D_{coil}$ is the inner diameter. The inner dimensions of the coil for a rectangular shape thereof are $D_{coil}$ and H, where $D_{coil}$=bD, $D_{coil}$ is the smallest inner dimension of the coil and b is a coefficient having a value in the range of 0.4-1.4. The height $b_{coil}$ of the electromagnetic coil 5 is equal to $b_{coil}$=cD, where c is a coefficient having a value in the range of 0.3-3.

Figure 1H:
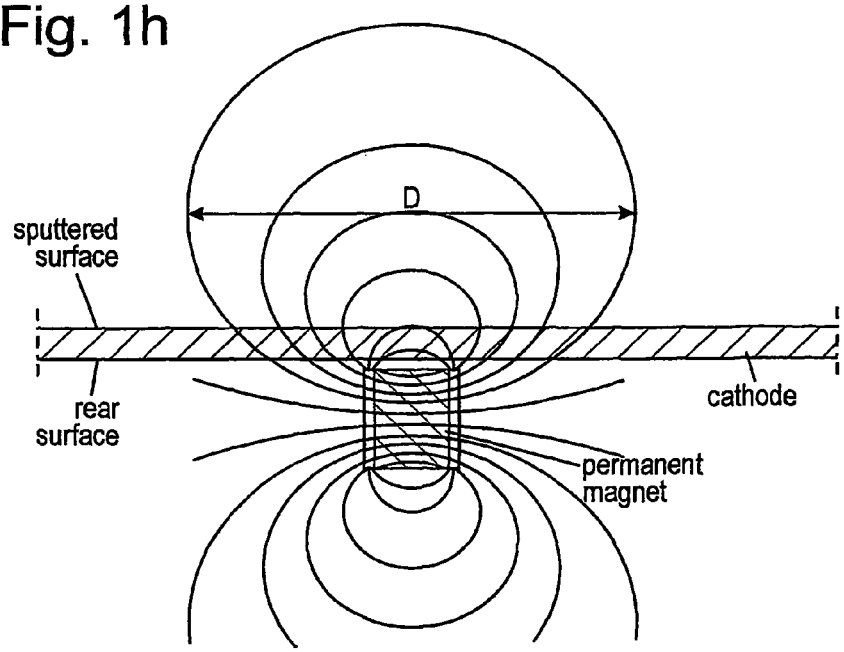
FIG. 1h is a schematic cross-sectional view showing the magnetic force lines in the magnetic configuration of FIG. 1g, FIGS. 2a and 2b are schematic diagrams illustrating limits between low and high current discharges of the quasi-stationary and non-quasi-stationary type respectively.

The magnetic configuration typical of magnetrons having a rotating magnet is illustrated in FIG. 1*g*, see also U.S. Pat. No. 5,252,194 for Richard A. Demaray et al. The permanent magnets 2' are positioned at the sputtering surface of the cathode 1 as shown in the figure. The magnet assembly 2' rotates around the center of cathode parallel to the rear surface thereof. The configuration of the magnetic force lines is seen in FIG. 1*h*. The configuration has a characteristic dimension D.

Generally, in the method described herein, magnetic configurations of the kinds illustrated in FIGS. 1*b*, 1*c*, 1*d*, 1*f* and 1*g* can be used. However, in the method discussed in the following the configuration including an unbalanced magnetron configuration as illustrated by FIG. 1*c* will be preferably considered.

Quasi-stationary discharges generated in balanced sputtering magnetron devices, such as in that shown in FIG. 1*b*, are characterized by an efficient cathode sputtering but a low ionization rate of the sputtering gas and metal vapor for low current discharges or by a low sputtering rate but by a very high ionization efficiency of the sputtering gas and metal vapor for high current discharges. Hence, it can be said that using low or high current quasi-stationary discharges in crossed fields it is impossible to generate intensive, highly ionized metal plasma fluxes.

Conventional methods of increasing plasma fluxes for low direct current magnetron discharges are preferably based on improvement of the plasma confinement properties of the magnetron magnetic configuration. These methods are obvious since the ionization efficiency in plasma largely depends on the electron density. The plasma confinement could be improved by increasing the magnetic field strength and/or by changes of the magnetic field configuration.

Figure 2A:
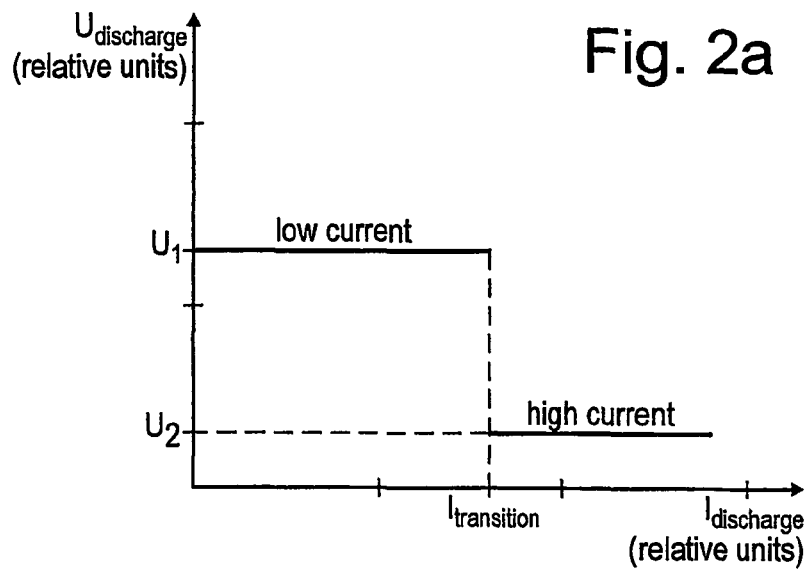
Figure 2B:
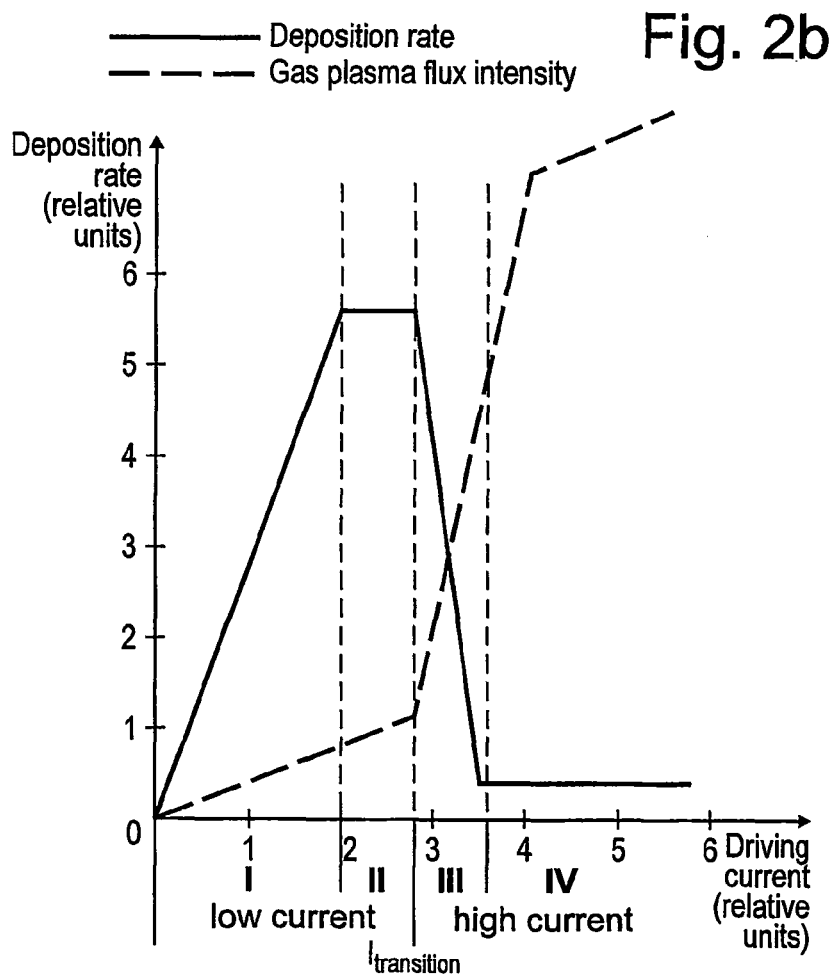

In the diagrams of FIGS. 2*a* and 2*b* the transition from the low intensity current region to the high intensity current region is shown. The diagram of FIG. 2*a* shows the voltage as a function of the discharge current for the case of quasi-stationary discharges. The transition current $I_{transition}$ corresponds to the discharge or driving current value when the high voltage, initial discharge continues to a low voltage discharge. When the plasma density is sufficiently high, what is achieved for a sufficiently high driving current, to establish nearly isotropic and equal ion and electron temperatures, the component $E_{//}$ of the electric field parallel to the magnetic B-field becomes small compared to the transverse component $E_{tr}$ thereof. The plasma then obeys the isorotation law according to which the angular velocity becomes uniform along a magnetic field line and the plasma rotates as a whole, a so called rotating plasma, see the article by B. Lehnert cited above. For low plasma densities, i.e. for a low driving current, quasi-stationary discharges also exist in which the longitudinal electric field $E_{//}$ cannot be neglected and the isorotation law becomes invalid. Recent systems include Penning cells as well as magnetron sputtering cathodes powered by direct current discharges. The isorotation phenomenon defines the limit between the low intensity and high intensity current quasi-stationary discharges. Practically, the transition from the low to the high current discharges results in a drop of the discharge voltage down to values corresponding to the Alfvén Limit.

The solid line and the dashed line in the diagram of FIG. 2*b* show the metal deposition rate and the gas plasma flux intensity respectively as functions of the driving current for the case of non-quasi-stationary discharges. In the low intensity current range, i.e. in the first two regions I and II, the deposition rate first increases, in the region I, and then becomes constant, in the region II, for an increasing driving current. In the high intensity current range, i.e. in the regions III and IV, the deposition rate first decreases, in the region III, and then becomes constant, in the region IV, for an increasing driving current. For non-quasi-stationary discharges this behavior of the deposition rate can be explained by the now discovered phenomenon of different dependencies of the intensity of gas and metal plasma production on the intensity of the discharge or driving current in a magnetron magnetic configuration. It is found that for an increasing intensity of the discharge current the intensity of the metal plasma production initially increases up to certain level and thereafter it is strongly decreasing, see the solid line of the diagram of FIG. 2*b*. The intensity of the gas plasma flux increases all the time for an increasing intensity of the discharge current.

Explanation of this phenomenon could be done by the phenomenon of generation of a high intensity current of secondary electrons emitted from the cathode by bombarding it by high intensity ions derived from the discharge driving current. Secondary electrons to be accelerated up to the high cathode voltage drop efficiently ionize gas and vapor by collisions between electrons and neutral particles and by the phenomenon of destabilization of the plasma of gas and sputtered vapor near the cathode. It results in excitation of plasma instabilities of a kinetic type that in turn strongly increase the effective collision frequency and thereby effectively heat the bulk of plasma electrons. According to P. Gopalraja and J. Foster, "Nonlinear wave interaction in a magnetron plasma", Applied Physics Letters, Vol. 77, No. 22, November 2000, pp. 3526-3528, the intensive beam of high-energy secondary electrons can drive beam-plasma-type instabilities.

Both the high electron density near the cathode and the high temperature of the electrons result in a phenomenon of efficient vapor ionization in the region of the cathode voltage drop. To be ionized in the region of the cathode voltage drop the gas and metal ions are returned back to the cathode surface by the electric field existing in that region, what is the self sputtering phenomenon. It results in a sharp reduction of the deposition rate if the discharge driving current exceeds a certain value. This value is shoved in FIG. 2b as the line for the current $I_{transition}$. This phenomenon is most obvious for cathodes produced from metals having low sputtering yields. At the opposite side of the cathode voltage drop region the sputtering and/or reactive gases are located, which are extremely efficiently ionized by the same phenomenon. For example, for a circular planar magnetron sputtering cathode of titanium and having a diameter of 150 mm, operating in the non-quasi-stationary regime for the following parameters: discharge current 1400 A and discharge voltage 500-600 V, the deposition rate is about zero and the ratio of $Ar^+$-current to $Ti^+$-current is 1:10 000. This phenomenon allows the design of a plasma source operating as a gas plasma source or as a gas-metal plasma source or as a metal plasma source which is very promising not only for PVD but also for CVD applications.

If the magnetron sputtering cathode operates only in the region of high intensity current non-quasi-stationary discharges or the region of combined high intensity current non-quasi-stationary discharges and high intensity current quasi-stationary discharges in crossed fields it produces preferably a gas plasma with a low contamination of a plasma of the cathode metal. If such discharges are used in combination with low intensity current discharges, the system operates as a gas-metal or metal plasma source, because the low current discharges allow the region of the magnetron magnetic configuration above the charge separation layer to be filled with metal vapor. This vapor is ionized together with the gas by the high current discharges. It is obvious that the system for a proper operation as a gas-metal or metal plasma source requires a specific timing of successive pulses and a specific choice of pulse durations. I.e., the duration of the vaporizing pulses must not be larger than the time-of-flight of the vapor blob across the magnetron magnetic configuration where the energy dissipation takes place.

The boundary between the low and high current non-quasi-stationary discharges could be specified as follows. A low intensity discharge current corresponds to the region where the deposition rate provided by the metal of magnetron sputtering cathode is all the time increasing or is about constant for an increasing discharge current, see the regions I and II respectively of the diagram of FIG. 2b. A high intensity discharge current corresponds to the region where the deposition rate provided by the metal of the magnetron sputtering cathode is all the time decreasing or is about constant for an increasing discharge current, see the regions III and IV of the diagram of FIG. 2b. Both the quasi-stationary and the non-quasi-stationary discharges have a transition from the low intensity current discharges to the high intensity current discharges provided that the power of the discharges exceeds the burn-out power, see the article by B. Lehnert cited above and the published International patent application No. WO 98/40532, and the corresponding driving current exceeds the burn-out current, see the lines for $I_{Transition}$ in the diagrams of FIGS. 2a and 2b. Reference can also be made to Karol Macak, Vladimir Kouznetsov, Jochen Schneider, Ulf Helmersson, Ivan Petrov: "Ionized sputter deposition using an extremely high plasma density pulsed magnetron discharge", J. Vac. Sci. Technol., A 18(4), July/August 2000, pp. 1533-1537.

In the case of discharges made in crossed electric and magnetic fields in magnetron sputtering cathode devices, for the calculation of the burn-out current the phenomenon of plasma turbulization has to be taken into account. It is necessary to notice that a low level of plasma turbulization can be obtained already in the low intensity discharge current, see FIG. 2b, region 11 and the portion of region I near region II, but it result in a low level, less than 10%, ionization rate of the sputtered vapor. This technology is already used practically in commercial SIP (Self Ionized Plasma) deposition sources, available from Applied Materials, see the Internet document Barry L. Chin, G. Yao, P. Ding, J. Fu and L. Chen, "Barrier and Seed Technologies for Sub-0.10 μm Copper Chips", Semiconductor International, May 2001, http://www.semiconductor.net/semiconductor/issues/2001/200105/04six0105 m . . .

The advantage of the methods and devices described herein resides particularly in the possibility to produce highly ionized, up to complete ionized, metal plasma flows.

In the diagrams of FIGS. 3a and 3b the current and voltage of pulses applied between the cathode 1 and the anode, not shown, the anode generally comprising the walls of the sputtering chamber, are illustrated as functions of time for achieving sputtering and ionizing discharges in crossed fields with a high efficiency. There, I is the discharge or driving current and U is the discharge voltage. The pulses comprise a first, long time interval, with a high voltage $U_1$ and low current $I_1$, for achieving a sputtering discharge followed by a second interval in which an ionizing discharge is generated. In the second interval, which is considerably shorter than the first interval, the applied voltage $U_2$ is low and the current $I_2$ is high. $t_1$ is the start time of the sputtering discharge interval and $t_2$ is the time when the sputtering discharge interval ends. $t_3$ is the time when the ionizing discharge starts which is here equal to $t_2$. $t_4$ is the time when the ionizing discharge period ends. $t_2$ is as well the time when the front of the sputtered vapor blob reaches the boundaries of the power dissipation region.

FIG. 4 is a diagram of the current of the pulses as functions of time schematically showing how the pulses are repeated with a pulse repeating period T.

FIG. 5 is a diagram similar to that of FIG. 4 but here, according to a second embodiment, the time intervals of the sputtering and ionizing discharges are separated by a short time interval of length $\Delta=(t_3-t_2)$ during which no voltage is applied.

FIGS. 6a, 6b are diagrams of the current as a function of time illustrating how the pulses can be applied according to a third embodiment. In the diagram of FIG. 6a a constant current IDC is shown used for achieving the sputtering discharge. This constant current is combined with a pulsed ionizing discharge as shown in FIG. 6b, the driving current $I_2$ during the pulses of the ionizing discharges being considerably higher than the constant current. $t_3$ is the start time of the intervals of the ionizing discharges beginning and $t_4$ is the time when the ionizing discharges end. FIG. 7a is a diagram showing the conductivity δ and plasma density n as a function of time in the plasma confinement region. The driving current pulses are shown in the diagram of FIG. 7b as a function of time. The filling of the plasma confinement region by metal vapor can be produced by a DC discharge, see FIGS. 6a, 6b, or by pulsed low current discharges, as in FIGS. 3a, 3b, 4 and 5. In FIG. 7a $δ_{max}$ and $n_{max}$ are the maximal conductivity of the discharge gap and the plasma density in the plasma confinement region produced by the ionizing discharge respectively and $δ_{min}$ and $n_{min}$ are the minimal conductivity and the plasma density respectively for the case when the sputtering magnetron discharge can be initiated without the presence of a sputtering gas. $T_{max}$ is the maximal time between ionizing pulses within which it is possible to initiate the sputtering magnetron discharges without the sputtering gas.

In tests of the magnetic configurations described in conjunction with FIGS. 1a-1g it was found that:
1. The strength and geometry of the magnetic field which define the plasma confinement properties strongly affect the transition of a low current EXB discharge into a high current EXB discharge or possibly into a contracted arc discharge. The configurations useful, and thus preferred here, for a stable operation without any contracted arc formation in low and high current quasi-stationary discharges are magnetic configurations are those schematically illustrated in FIGS. 1b, 1c, 1d, 1f and 1g as has been indicated above.
2. Plasma inhomogeneities like contracted arcs prevail during a quasi-stationary holding mode in systems having large plasma losses, i.e. low confinement properties.
3. The process of contracted arc formation depends on the initial plasma density in the magnetic trap in the start period of the ionizing high current discharge in crossed fields.
4. For application of discharges in crossed fields to magnetron sputtering cathodes a most important phenomenon comprises the formation of cathode spots. It is a well known fact that cathode spots are formed if the field emission of electrons from the cathode is replaced by a thermoelectric emission, resulting in an explosive electron emission and transformation of the cathode metal, at sharp inhomogeneities on the cathode surface, into dense plasma blobs. These plasma blobs form plasma inhomogeneities, which are centers of concentrated arc formation. It is obvious that in order to reduce the probability of explosive electron emission it is necessary to remove the sharp inhomogeneities from the cathode surface. It was found that the direct current, low intensity quasi-stationary and low intensity non-quasi-stationary discharges are efficient methods of cathode surface polishing and, in contrast, high current intensity quasi-stationary and non-quasi-stationary discharges are very efficient methods of roughening the cathode surface. Therefore, if only high current intensity, quasi-stationary and especially non-quasi-stationary discharges are used for plasma production the formation of concentrated cathode arcs increases with the duration of the deposition process. If double-pulse discharges or a combination of an applied direct or constant current and high current pulsed discharges are used the formation of concentrated cathode arcs is strongly suppressed. Thus, the contracted arc discharges can be suppressed by suitably selected arc suppression schemes incorporated in the plasma driving power supply.

The phenomenon mentioned above show that in order to avoid formation of arc discharges during high current discharges it is necessary to start the high current discharge with a sufficient initial conductivity of the discharge gap. It can be achieved by having a sufficient plasma density in the magnetic trap in the start period of the discharge, see FIG. 7, and maintaining low plasma losses during the discharge.

It was found that in terms of the electric, magnetic and time parameters of the discharge device used in order to avoid arc formation, it is necessary to use the following values of the parameters:
a. The magnetron magnetic configuration of the balanced type, see FIG. 1b, has to have a maximum radial strength of the magnetic field of 0.07-0.3 T at the sputtering surface of cathode, the radial directions taken parallel to the plane of the front surface of the target or cathode.
b. The magnetron magnetic configurations of the unbalanced type, see FIGS. 1c and 1d, have to have a maximum radial strength of the magnetic field of 0.04-0.3 T at the sputtering surface of cathode.
c. The cusp-shaped axis-symmetric magnetic configuration, see FIG. 1f, has to have a maximum radial strength of the magnetic field of 0.04-0.3 T at the sputtering surface of cathode. The cusp-shaped magnetic configuration used is created by a balanced magnetron magnetic field produced by a permanent magnetic system combined with the magnetic field from a toroidal electromagnetic coil having a relatively small diameter.
d. Low and high current discharges have to be periodically repeated and following one after another in time with a pulse repetition frequency f of the magnitude of order of 100 Hz-20 kHz, in particular with a frequency of 0.5-2 kHz, where f=1/T and T is the repetition period of the pulses.

It was found that if the repetition frequency f is less than 20 Hz, the ignition of the low and high current pulsed periodic discharges could not be achieved without an external pre-ionization. Without an external pre-ionization the discharges have a random occurrence and appear in the form of contracted arc discharges. In the region of 20-100 Hz the discharges can be periodically ignited without any external pre-ionization because of the residual electrical conductivity of the discharge gap. The residual conductivity is caused by residual plasma remaining in the magnetic configuration from the previous pulse. If the pulse repetition frequency has a value of 20-100 Hz, the plasma remaining in the magnetic configuration from the previous pulse has a low density and formation of arc discharges has a high probability, especially for the high current discharges. This is true for all magnetic field parameters mentioned above in the paragraphs under a, b, c. If the magnetic field strength is less than 0.03 T the high current quasi-stationary discharges cannot be started at all.

If the pulse repetition frequency is higher than 100 Hz the low and high current, pulsed, periodic discharges have a stable arc-free operation if the magnetic field parameters are selected in accordance with that told in the paragraphs a, b, c above.

The pulse repetition frequency is a decisive factor for achieving a selfsputtering regime. The selfsputtering regime for presence of a sputtering gas such as Ar can be achieved already at a frequency somewhat higher than 100 Hz. This is the argon assisted selfsputtering regime. Without sputtering gas the selfsputtering regime occurs at frequency higher than 500 Hz.

After the start period it is possible to initiate the low and high current EXB discharges in the residual plasma density remaining from the previous pulse. In this case metal vapor is produced by the selfsputtering phenomenon and the plasma filling the magnetic trap contains primarily ions of the target metal. The plasma flow from the magnetic trap contains preferably ions of the target metal as well. The selfsputtering phenomenon can be produced for any type of cathode material if the low and high current discharges are used following each other or generally by a DC discharge followed by a high current discharge, see FIGS. 3a-7, and if the conditions mentioned in the paragraphs a-d above are fulfilled. The selfsputtering regime is highly important for such applications as directional etching or cleaning of work pieces surface by metal ions for increasing the adhesion of deposited layers or for fling high-aspect-ratio trenches and vias encountered in microelectronic fabrication.

In the diagram of FIG. 7a the selfsputtering phenomenon is illustrated. The low current discharge having a current intensity $I_1$ fills the magnetic trap near the cathode by a metal vapor. The ionization degree of the gas and metal vapor by the low current discharge is negligible compared to those for the high current discharge and is not plotted in FIG. 7a. The high current discharge ionizes the vapor and the sputtering gas. The plasma density increases from the value $n_{min}$ up to value $n_{max}$ during the period from $t_2, t_3$ up to $t_4$. The corresponding conductivity of the discharge gap increases from the value $\sigma_{min}$ up to the value $\sigma_{max}$. After the ending time $t_4$ of the high current discharge a period of plasma decay starts. It results in that the conductivity of the discharge gap decreases down to $\sigma_{min}$. The values $n_{min}$ and $\sigma_{min}$ depend on the pulse repetition period T, $n_{max}$ and the plasma confinement properties of the magnetic configuration, i.e. of the magnetic trap, provided that the parameters are within the ranges of the parameters indicated in the paragraphs a-d above. The regime demonstrated by FIG. 7 can only be achieved by filling the magnetic trap with metal vapor produced by low current discharges having the amplitude II. In this case the presence of gas is necessary just to start the discharges.

The method described herein comprising metal plasma production by producing a metal vapor using magnetron sputtering and a following ionization of the produced vapor by pulsed discharges in crossed fields has some similarities to the RF-method described above. In that method metal plasma fluxes are produced by low current stationary EXB discharges in magnetron magnetic configuration for sputtering atoms in a moderate pressure, e.g. of 1-100 mTorr, producing a low-density plasma. In that case the plasma is produced by an RF-induction coil mounted inside the deposition chamber. The electron density produced in induction plasmas is of the range of $10^{17}$-$10^{18}$ ml$^{-3}$. The drawbacks of the RF-method of metal plasma production include the complexity of the RF-ionization technique and the required high pressure of the sputtering gas, which as well is used for producing the low-density plasma.

Trap dimensions and metal vapor expansion speed define the time required for filling the magnetic trap with metal vapor. The characteristic metal vapor expansion speed can be obtained from the energy distribution of the sputtered atoms. The energy distribution of the sputtered atoms according to linear collision cascade theory is described by the Thompson formula, which was originally derived for energies of the keV-range. Later, experiments confirmed that this formula is valid down to the eV-range, see H. Oechsner, "Energieverteilungen bei der Festkörperzerstäubung durch Ionenbeschuss", Zeitschrift für Physik A, No. 238, 1970, pp. 433-451. For different metals the characteristic metal vapor characteristic expansion speed is of the order of magnitude of $10^3$-$3\cdot^3$ m/s.

Furthermore, it was found that the characteristic height h, see FIGS. 1c, 1f of the magnetic trap or confinement region should be of the order of the target diameter D for a planar circular geometry or of the smaller dimension D of a rectangular cathode. The dimensions D and h define the power dissipation volume inside of magnetic trap.

Practically, the duration $(t_2-t_1)$ of the first period in the pulses for the low current discharge is equal to the time of filling the power dissipation volume inside the magnetic trap by a metal vapor. The duration should be $\beta_1 D$, where the constant 131 is measured in μs/cm and has a value in the range of 0.1-3 μs/cm and D is measured in cm. The duration $(t_4-t_3)$ of the period for the high current discharges in the pulses depends on the dimension D and h as well and has a value $\beta_2 D$, where the constant $\beta_2$ is measured in μs/cm and has a value in the range of 0.1-1 μs/cm and D is measured in cm.

The second periods of the pulses for the high-current discharges can follow directly exactly after the first periods of the pulse for the low-current discharge as shown by the diagram of FIGS. 3a, 4 and 7b. These second periods can also start some time $\Delta=(t_3-t_2)$ after the ends of the preceding first periods as shown by the diagram of FIG. 5. The value of this delay time $\Delta$ depends on the required ionization rate of the metal vapor blob and is of the magnitude of order $\Delta=cD$ where c is a constant, measured in s/cm, and has a value in the range of $5\cdot10^{-8}$-$10^{-6}$ s/cm and D is measured in cm as above.

The production of the metal plasma can, using the method as described above comprising pulses having two different current levels, be achieved also by producing continuously a flow of metal vapor by a DC discharge and accompanying it by pulsed high current ionizing quasi-stationary discharges, see the diagrams of FIGS. 6a, 6b. In this case the repetition period T of the pulsed discharges is defined by expansion speed of the metal vapor and by the dimensions of the magnetic trap. The repetition period of the high current discharge is equal to the sum of a low current pulse duration of $\beta_1 D$, as defined above, where the constant $\beta_1$ is measured in μs/cm and has a value in the range of 0.1-3 μs/cm, and the high current discharge pulse duration $\beta_2 D$ defined above, where the constant $\beta_2$ is measured in μs/cm and has a value in the range of 0.1-1 μs/cm.

As can be seen in the diagrams of FIGS. 3a-7, the discharges are preferably produced so that in each pulse or pulse portion the current as a function of time has a rectangular shape.

Furthermore, the discharges are preferably produced so that in the first periods, for the pulses shown in FIGS. 3a-5, the driving current between the anode and the cathode is $\mu_1 S$, where $\mu_1$ is a constant measured in A/cm$^2$ having a value in the range of 0.1-1 A/cm$_2$, and S is the area of the active surface of the cathode measured in cm$^2$. Also, the discharges are also preferably produced so that in the second periods for the pulses shown in FIGS. 3a-5 and in the high current pulses shown in FIG. 6b, the driving current between the anode and the cathode is $\mu_2 S$, where $\mu_2$ is a constant measured in A/cm$^2$ and has a value in the range of 1-10 A/cm$^2$ and S is the area of the active surface of the cathode measured in cm$^2$.

The magnetrons including rotating magnets have to be considered separately. For calculation of the required values of the low and high current pulses the sputtering area of the cathode for a fixed magnet has to be chosen. The sputtered area is measured in cm$^2$. The coefficients for the low and high current pulses are equal to the coefficients for the magnetron configuration according to the schematic of FIG. 1c, which is chosen as the basic configuration. For calculation of pulse durations the characteristic dimension D, see FIG. 1h, has to be taken as the dimension of the sputtered area for a fixed magnet in the direction coinciding with the direction N-S inside the permanent magnet.

In the chamber in which discharges are made a mixture of sputtering and reactive gases can exist at a pressure of preferably $10^{-10}$-$10^{-2}$ Torr.

Figure 8C:
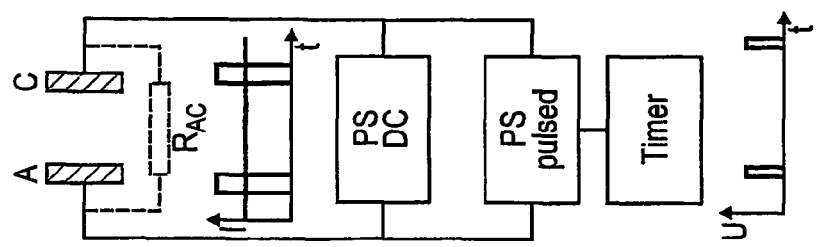
FIG. 8c is a diagram similar to that of FIG. 8a of a device having a single pulsed power supply combined with a DC power supply.
Figure 8B:
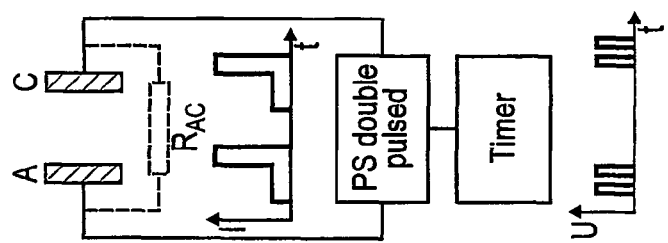
FIG. 8b is a diagram similar to that of FIG. 8a of a device including a single pulsed power supply having a variable impedance.
Figure 8A:
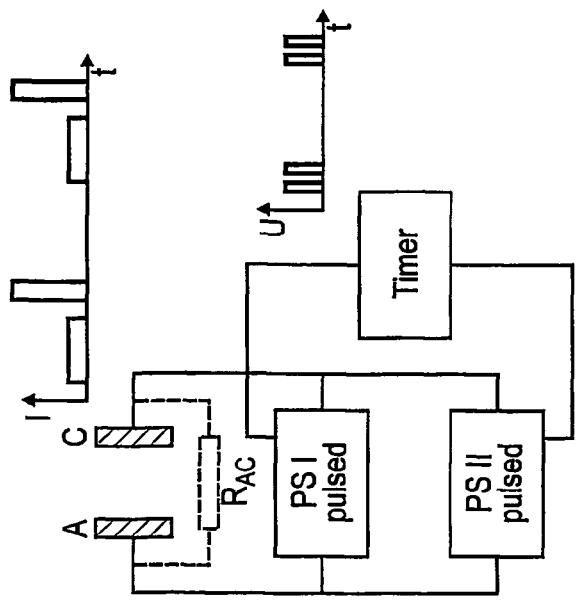

In FIGS. 8a, 8b and 8c electrical circuit diagrams of devices for producing of metal vapor and the ionization thereof according to the method described above are shown. The devices for performing the method of preferably gas or gas-metal or preferably metal plasma production comprise four main parts, see FIGS. 8a-8b:

1. the magnetron sputtering cathode 1 or C,
2. a pulsed or DC power supply for achieving sputtering of the cathode,
3. a pulsed power supply for ionization of gas and metal vapor,
4. a timer for coordination of the operation of the power supplies.

The magnetron sputtering cathode 1, C is of the balanced or unbalanced type or a combination of a cathode having a balanced magnetic configuration and an electromagnetic coil producing an additional magnetic field, as described above. The DC power supply powers the magnetic coil 5. The integral magnetic field is of the unbalanced or of the cusp-shaped configuration, see FIGS. 1*d* and 1*f*. If the magnetron magnetic configuration is of balanced type the maximum value of the radial component of the magnetic field at the sputtering surface of cathode is in the range of 0.07-0.3 T. If the unbalanced magnetron magnetic configuration is used, the maximum value of the radial component of the magnetic field at the sputtering surface of the cathode is in the range of 0.04-0.3 T. If the cusp-shaped axially symmetric magnetic configuration is used the maximum value of the radial component of the magnetic field at the sputtering surface of cathode is in the range of 0.04-0.3 T.

In FIG. 8*a* a diagram of an electrical circuit is shown having two pulsed power supplies connected in parallel with each other and connected to the discharge device, i.e. to the magnetron sputtering cathode 1, C and the anode A. The anode of the discharge can be the walls of the vacuum chamber, which is then connected to ground, or a specially designed anode, which can have an electric potential separate from the ground or have the ground potential. A first power supply PS-1 produces pulses for sputtering the target, i.e. the low-current part of the discharges. A second power supply PS-2 produces pulses for ionization of the sputtered metal vapor and sputtering and reactive gases, i.e. the high-current part of the discharges. The timer 11 produces double triggering pulses. The time intervals between the triggering pulses and the repetition frequency thereof are variable. $R_{AC}$ is the characteristic impedance of the discharge gap, i.e. of the path between anode A and cathode 1, C.

In the circuit diagram of FIG. 8*b* instead a system comprising only one pulsed power supply having a variable impedance is shown. The timer 11 produces double triggering pulses as described above.

In FIG. 8*c* the electric wiring of a system having one pulsed power supply combined with a DC power supply is shown. The timer here produces only single triggering pulses having a variable repetition frequency.

Figure 9:
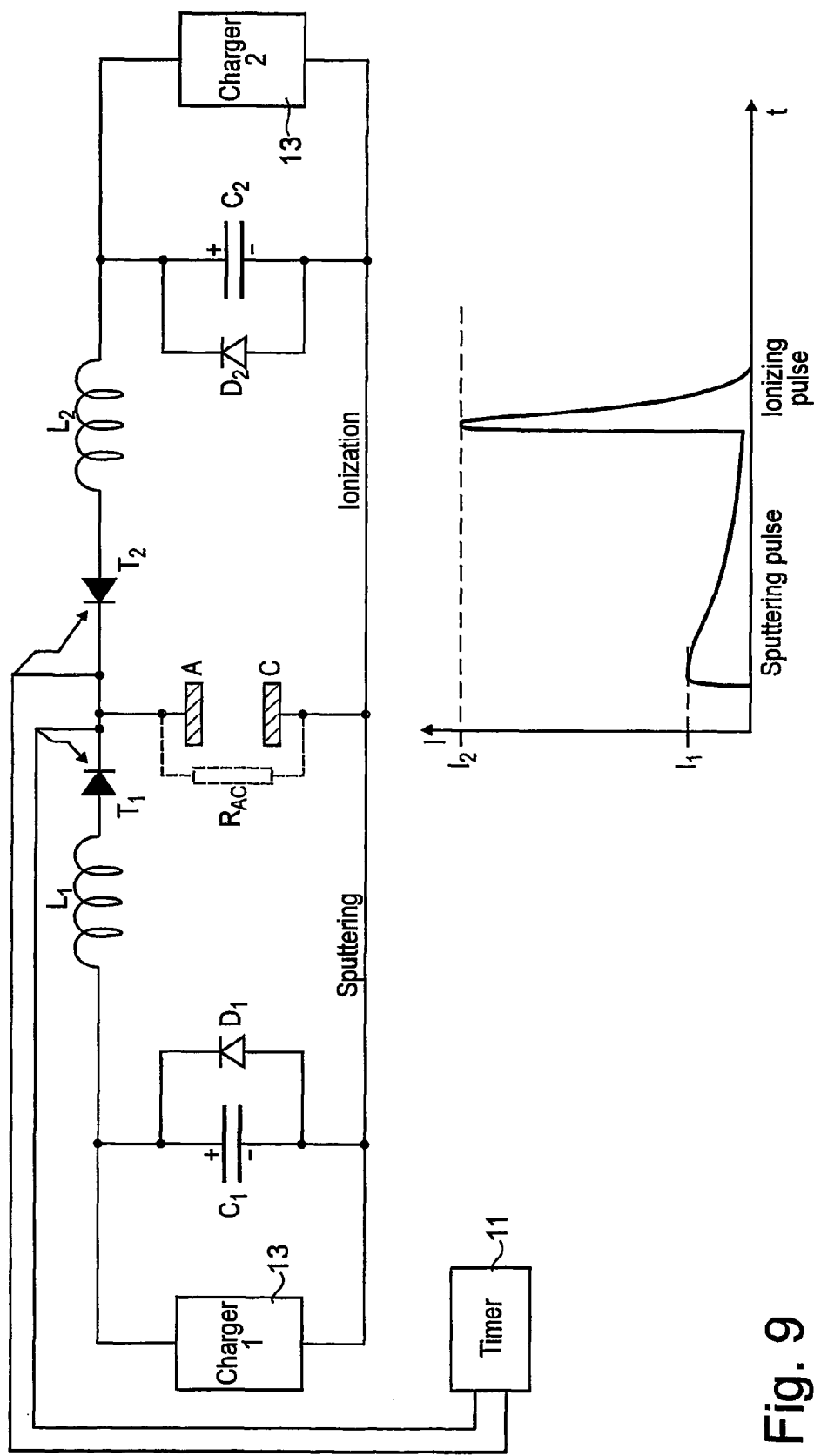
FIG. 9 is a detailed electrical circuit diagram corresponding to the diagram of FIG. 8a, FIG. 10 is a detailed electrical circuit diagram corresponding to the diagram of FIG. 8b.

The detailed circuit illustrated in FIG. 9 corresponds to that shown in FIG. 8*a*. The circuit comprises the two pulsed power supplies PS-1, PS-2 connected in parallel to each other, and each power supply based on a CL-circuit or CL-oscillator. Each power supply comprises a capacitor $C_1$, $C_2$ connected in parallel to a charger circuit 13 and diodes $D_1$, $D_2$. One terminal of the capacitors is connected to the anode A through an inductance $L_1$, $L_2$ and a switch $T_1$, $T_2$. The inductances $L_1$ and $L_2$ are used for limiting the discharge currents. The $L_1$ inductance is as high as necessary for producing the low current sputtering pulses. The $L_2$ inductance is as low as necessary for producing the high current ionizing pulses. Thyristors are used as switches $T_1$, $T_2$. In principle any type of fast, high current switches are suitable. The timer 11 produces double pulses for starting the pulsed discharges, e.g. as shown in FIG. 4. The chargers 13 are of any type pulsed charger. The capacitors $C_1$ and $C_2$ are charged during the time between the sputtering and ionizing processes. The diodes $D_1$, $D_2$ short-connect the capacitors $C_1$, $C_2$ for preventing reverse polarity pulses. Reverse polarity pulses can appear if the characteristic impedance RAC of the discharge gap is too low.

Figure 10:
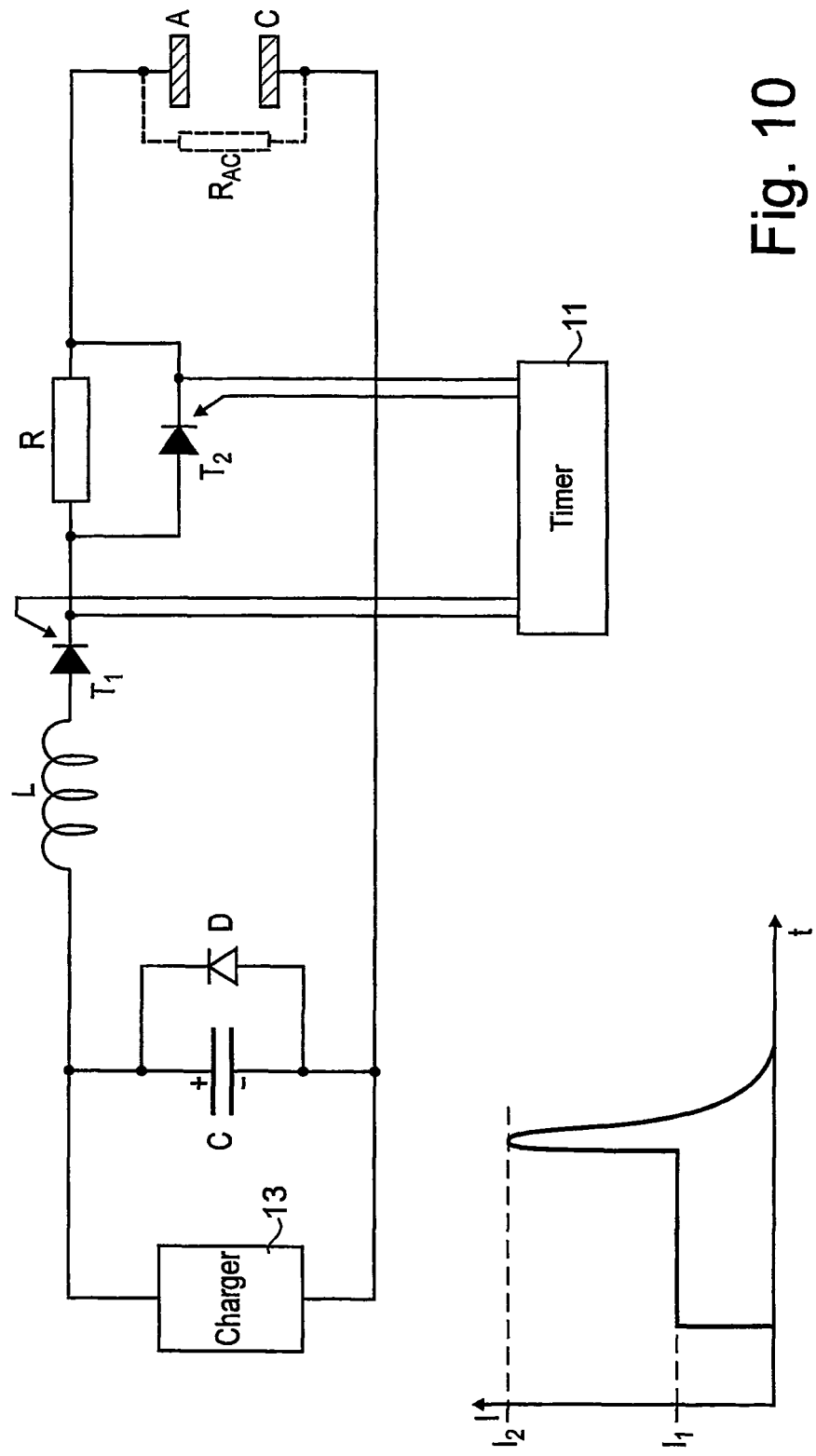

The detailed circuit illustrated in FIG. 10 corresponds to that shown in FIG. 8*b*. The circuit has a single pulsed power supply of the same CL-type as used in FIG. 9. However, a limitation of the discharge current is achieved by a resistor R which is connected in series with the switch $T_1$ and the inductance $L_1$ of the power supply and can be short-connected by a thyristor switch $T_3$ connected in parallel with the resistor, after a certain time period, necessary for vapor production. The timer 11 produces double pulses provided to the switches $T_1$ and $T_3$ to give pulses as shown in e.g. FIG. 4.

Figure 11:
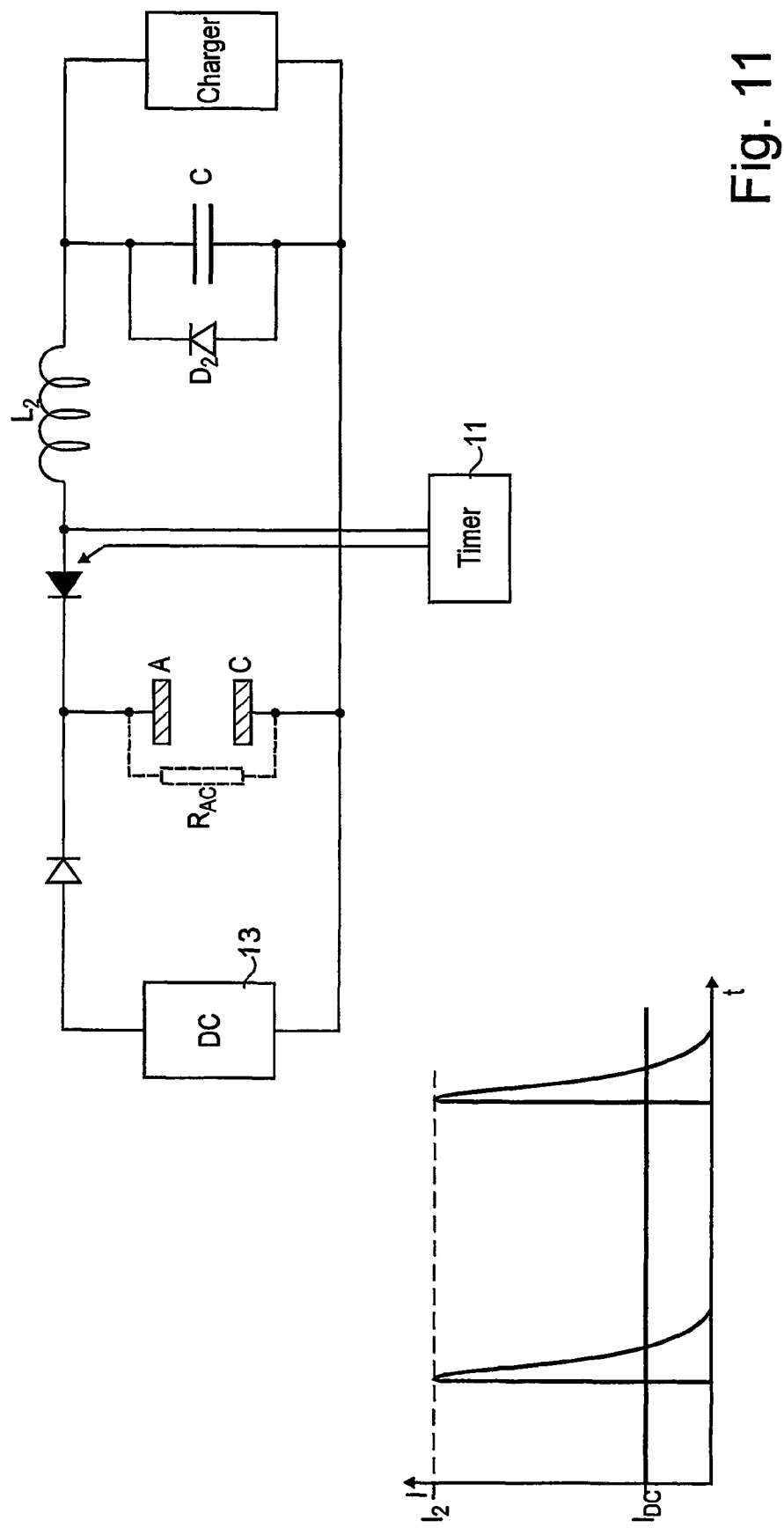
FIG. 11 is a detailed electrical circuit diagram corresponding to the diagram of FIG. 8c.

The detailed circuit illustrated in FIG. 11 corresponds to that shown in FIG. 8*c*. The circuit has a single pulsed power supply of the same CL-type as used in FIG. 9 and a DC power supply connected to the anode and cathode through a diode $D_3$. The timer produces single pulses for generating discharge pulses as shown in FIG. 6.

FIGS. 12*a* and 12*b* are schematic cross-sectional views of plasma sources utilizing discharges in crossed electric and magnetic fields for gas or gas and metal or metal plasma production. As an injector of metal vapor into the ionization region a planar magnetron sputtering cathode is used.

In FIG. 12*a* the unbalanced magnetron magnetic configuration of the second type as indicated in FIG. 1*c* is shown. The permanent magnetic system 21 is thus the unbalanced type, type 2, and is located at the rear side of the cathode 23. The magnetic system has to create a magnetic field having a maximum intensity 0.3 T of its radial component at the active or front surface of the cathode 23. A mechanical system 22 is arranged for adjusting the magnetic field intensity in the central front region 5 at the front surface of the cathode. The limits for the magnetic field adjustment are 0.04 T and 0.3 T. The precision of the magnetic field adjustment is 0.005 T.

The cathode 23 is a circular or rectangular planar magnetron sputtering cathode of conventional type. The anode 24 of the EXB discharge includes the sidewalls of the sputtering chamber which comprise a cylindrical or rectangular tube 35 and a planar diaphragm 32 including an outlet 34 for the plasma flow. The outlet 34 has the shape of a contracting nozzle. The inner surface of the nozzle 34 is configured as a magnetic field surface. The cross-section of the nozzle 34 as taken perpendicularly to the axis of the plasma source has a circular shape for a circular cathode 23 or a rectangular shape for a rectangular cathode. The anode 24 is connected to ground as indicated at 31.

The cathode 23, the anode 24, and the permanent magnetic system 21 are all water-cooled. The water inlet and outlet openings are shown at 30. An electrical insulator 28 is arranged between the anode 24 and the cathode 23. A gas inlet opening 29 is provided in the cylindrical tube 35 for supplying the gas into the anode vessel.

The power supply 26 is arranged according to one of FIGS. 8*a*-FIG. 11. The repetition frequency of the applied pulses is variable from 100 Hz up to 20 kHz. The power supply 26 has to generate, for a resistive load of 1 ohm, pulses having peak voltages in the range of 0.4-4 kV. The power supply 26 has to operate with a resistive load of $2 \cdot 10^{-3}$ (cm$^{-2}$) S ohm. The area S is the area of the sputtered cathode surface measured in cm$^2$. The rise time of the current pulse from 0 A up to the peak current is $10^{-5}$ s in a resistive load of 0.3 ohm. The power supply 26 is connected to the plasma source by a coaxial cable 27. The coaxial cable connection is used for reducing the inductance of the line between the power supply and the plasma source. It allows that the required rise time of the ionizing discharge current is achieved. The rise time of the ionizing discharge current has to be less than the time of flight of metal vapor blobs across the magnetic field configuration 25 at the active front side of the cathode 23.

In the schematic cross-sectional view of FIG. 12*b* the magnetron magnetic configuration indicated in FIGS. 1*d* and 1*f* is shown in some more detail. These magnetic configurations are obtained by a permanent magnetic system of the balanced type as shown in the schematic of FIG. 1*b* and by arranging an unbalancing electromagnetic coil 36. Otherwise, the design of the plasma source is as similar to that illustrated in FIG. 12*a*.

The magnetic field intensity created by the permanent magnetic system 21 and the precision of the field adjustment are identical to those described with reference to FIG. 12a The electromagnetic coil 36 creates a magnetic field having an intensity sufficient to obtain, at the center of the sputtering cathode 23 surface, a field intensity of up to 0.15*T*. The magnetic field generated by the electromagnetic coil 36 is variable from 0 T up to the maximum intensity with a precision of 0.001 T.

The plasma sources according to FIGS. 12*a* and 12*b* are connected to a vacuum vessel 33.

The plasma sources of FIGS. 12*a* and 12*b* operate as follows. The initial magnetic field intensity is 0.15 T. The sputtering and ionizing gases are supplied into the anode vessel 24 through the gas inlet 29. The initial operating pressure is in the range of $10^{-2}$-$10^{-4}$ Torr. After the required operating pressure has been achieved the power supply 26 is switched on. The power supply 26 supplies the low intensity current and high intensity current pulses to the plasma source. The initial repetition frequency of the applied pulses is 100 Hz. After the discharge has been ignited the magnetic field intensity and the repetition frequency of the pulses are adjusted to obtain discharges without any concentrated arc formation. If the self-sputtering mode of plasma source operation is desired, the repetition frequency of the pulses is increased with a simultaneous reduction of the operating pressure. The repetition frequency of the pulses is increased up to the value when the plasma source can operate without operating gas. The basic (operating) pressure has to be less then $10^{-4}$-$10^{-5}$ Torr. In this regime the plasma source produces only metal plasma.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

The invention claimed is:

1. A method of producing plasma flows of either a metal, a gas, or a metal and a gas, the method comprising the steps of:
periodically producing high electric discharges between an anode and a metal magnetron sputtering cathode, in crossed electric and magnetic fields in a chamber containing a low pressure gas, the cathode being formed from a metal or metals necessary for metal plasma production,
producing a metal vapor by continuous direct-current discharge between the anode and cathode, said direct-current discharge having a first polarity and having a constant amplitude, said continuous direct-current discharge caused by continuously passing a low constant electrical current between the anode and cathode to thereby produce a relatively dense metal vapor with relatively few metal ions by magnetron cathode sputtering, and
producing the periodic high electric discharges, said periodic high electric discharges having amplitudes of the same polarity as the direct-current discharges and having amplitudes greater than the constant amplitude of the direct-current discharge, said periodic high electric discharges produced by passing a high pulsed electrical current between the anode and cathode to thereby produce a relatively highly ionized metal vapor and relatively low amounts of sputtered metal atoms, the high pulsed electrical current being superimposed on the low constant electrical current between the anode and cathode;
wherein the metal magnetron sputtering cathode is operated during the direct-current discharge in a low intensity operating state where the deposition rate is increasing with increasing discharge current, and where the metal magnetron sputtering cathode is operated during the periodic discharges in a high intensity operating state where the deposition rate is decreasing with increasing discharge current;
wherein the current density of the high pulsed electrical current discharges being produced so that a driving current between the anode and the cathode is μ2S, where μ2 is measured in A/cm2 and having a value in the range of 1-10 A/cm2 and S is the area of the active surface of the cathode measured in cm2; and
wherein pulses of said high pulsed electrical current have one duration and intervals between said pulses have a different duration, and the intervals between pulses are longer than the duration of the pulses.

2. The method according to claim 1, wherein the periodic high pulsed electrical current discharges are non-quasi-stationary and are made in crossed electric and magnetic fields.

3. The method according to claim 1, wherein an unbalanced magnetron magnetic configuration is provided at said magnetron sputtering cathode, said unbalanced magnetron magnetic configuration comprising a permanent magnet arranged to provide a magnetic field strength parallel to a flat surface of said target is of 0.04-0.3T.

4. The method of claim 1 wherein the direct current discharge produces a plasma with a density of less than $10^{18}$ charged particles per cubic meter and the pulses of electrical current produce a plasma with a density of more than $10^{18}$ charged particles per cubic meter.

5. A method of producing plasma flows of either a metal, a gas, or a metal and a gas, the method comprising the steps of:
periodically producing intermittent high electric discharges between an anode and a metal magnetron sputtering cathode, in crossed electric and magnetic fields in a chamber containing a low pressure gas, the cathode being formed from a metal or metals necessary for metal plasma production,
producing a metal vapor by continuous direct-current discharge between the anode and cathode caused by continuously passing a low constant electrical current between the anode and cathode to thereby produce a relatively dense metal vapor with relatively few metal ions by magnetron cathode sputtering, said low constant electrical current having a first polarity and having a constant amplitude, and producing the intermittent periodic electric discharges by
passing a high pulsed electrical current between the anode and cathode to thereby produce a relatively highly ionized metal vapor and relatively low amounts of sputtered metal atoms, the intermittent periodic high pulsed electrical current having the same polarity as the low constant electrical current and being superimposed on the low constant electrical current between the anode and cathode;
wherein intervals of said high pulsed current between pulses are longer than the duration of the pulses;
wherein the metal magnetron sputtering cathode is operated during the direct-current discharge in a low intensity operating state where the deposition rate is increasing with increasing discharge current, and where the metal magnetron sputtering cathode is operated during the periodic discharges in the high intensity operating state where the deposition rate is decreasing with increasing discharge current;

wherein the current density of the high pulsed electrical current discharges being produced so that a driving current between the anode and the cathode is $\mu_2 S$, where $\mu_2$ is measured in A/cm$^2$ and having a value in the range of 1-10 A/cm$^2$, and S is the area of an active surface of the cathode measured in cm$^2$.

6. The method according to claim 5 wherein the high intensity current discharges are non-quasi-stationary and are made in crossed electric and magnetic fields.

7. The method according to claim 5, wherein an unbalanced magnetron magnetic configuration is provided at said magnetron sputtering cathode, said unbalanced magnetron magnetic configuration comprising a permanent magnet arranged to provide a magnetic field strength parallel to a flat surface of said target is of 0.04-0.3 T.

8. The method according to claim 5 wherein the direct current discharge produces a plasma with a density of less than 10$^{18}$ charged particles per cubic meter and the pulses of electrical current produce a plasma with a density of more than 10$^{18}$ charged particles per cubic meter.

9. A method for producing plasma flows of either a metal, a gas, or a metal and a gas, the method comprising the steps of:
periodically producing intermittent high electric discharges between an anode and a metal magnetron sputtering cathode, in crossed electric and magnetic fields in a chamber containing a low pressure gas, the cathode being formed from a metal or metals necessary for metal plasma production,
producing a metal vapor by continuous direct-current discharge between the anode and cathode caused by continuously passing a low constant electrical current between the anode and cathode to thereby produce a relatively dense metal vapor with relatively few metal ions by magnetron cathode sputtering, said low constant electrical current having a first polarity and having a constant amplitude, and
producing the periodic intermittent high electric discharges by passing a high pulsed electrical current between the anode and cathode for a duration of a pulse and thereafter returning the electrical current to the continuous direct-current discharge between pulses to thereby produce a relatively highly ionized metal vapor and relatively low amounts of sputtered metal atoms, the periodic intermittent high pulsed electrical current being superimposed on the low constant electrical current between the anode and cathode and having the same polarity as the low constant electrical current; and wherein the metal magnetron sputtering cathode is operated during the direct-current discharge in a low intensity operating state where the deposition rate is increasing with increasing discharge current, and where the metal magnetron sputtering cathode is operated during the periodic discharges in a high intensity operating state where the deposition rate is decreasing with increasing discharge current and wherein intervals between pulses of said high pulsed electrical current are longer than the duration of the pulses;

wherein the current density of the high pulsed electrical current discharges being produced so that a driving current between the anode and the cathode is $\mu_2 S$, where $\mu_2$ is measured in A/cm$^2$ and having a value in the range of 1-10 A/cm$^2$, and S is the area of an active surface of the cathode measured in cm$^2$.

10. The method according to claim 9, wherein the high intensity current discharges are non-quasi-stationary and are made in crossed electric and magnetic fields.

11. The method according to claim 9, wherein an unbalanced magnetron magnetic configuration is provided at said magnetron sputtering cathode, said unbalanced magnetron magnetic configuration comprising a permanent magnet arranged to provide a magnetic field strength parallel to a flat surface of said target is of 0.04-0.3 T.

12. The method of claim 9 wherein the direct current discharge produces a plasma with a density of less than 10$^{18}$ charged particles per cubic meter and the pulses of electrical current produce a plasma with a density of more than 10$^{18}$ charged particles per cubic meter.

* * * * *

UNITED STATES PATENT AND TRADEMARK OFFICE
CERTIFICATE OF CORRECTION

PATENT NO. : 8,685,213 B2
APPLICATION NO. : 10/480826
DATED : April 1, 2014
INVENTOR(S) : V. Kouznetsov It is certified that error appears in the above-identified patent and that said Letters Patent is hereby corrected as shown below:

In the Claims

| COLUMN | LINE(S) | |
|---|---|---|
| 20 (Claim 1) | 14 | delete "μ2" at both occurrences, and insert --$\mu_2$--, both occurrences |
| 20 (Claim 1) | 14-17 | delete "cm2" in all three occurrences and insert --$cm^2$-- |

Signed and Sealed this
Sixteenth Day of December, 2014

Michelle K. Lee
*Deputy Director of the United States Patent and Trademark Office*